(12) United States Patent
Takahashi

(10) Patent No.: US 9,679,634 B2
(45) Date of Patent: Jun. 13, 2017

(54) SEMICONDUCTOR DEVICE

(71) Applicant: Renesas Electronics Corporation, Kawasaki-shi (JP)

(72) Inventor: Hiroyuki Takahashi, Kawasaki (JP)

(73) Assignee: RENESAS ELECTRONICS CORPORATION, Kawasaki-Shi, Kanagawa (JP)

( * ) Notice: Subject to any disclaimer, the term of this patent is extended or adjusted under 35 U.S.C. 154(b) by 1 day.

(21) Appl. No.: 14/685,491

(22) Filed: Apr. 13, 2015

(65) Prior Publication Data

US 2015/0325283 A1 Nov. 12, 2015

(30) Foreign Application Priority Data

May 9, 2014 (JP) .................................. 2014-097572

(51) Int. Cl.
*G11C 5/02* (2006.01)
*G11C 11/4099* (2006.01)
*G11C 7/02* (2006.01)
*G11C 11/4097* (2006.01)
*G11C 11/4074* (2006.01)

(52) U.S. Cl.
CPC ............ *G11C 11/4099* (2013.01); *G11C 7/02* (2013.01); *G11C 11/4097* (2013.01); *G11C 11/4074* (2013.01)

(58) Field of Classification Search
CPC ....... G11C 11/4099; G11C 5/025; G11C 5/04; G11C 5/063
See application file for complete search history.

(56) References Cited

U.S. PATENT DOCUMENTS

| 2003/0015742 | A1* | 1/2003 | Ogawa | H01L 27/10852 257/296 |
| 2005/0278592 | A1* | 12/2005 | Yamada et al. | 714/721 |
| 2006/0158924 | A1* | 7/2006 | Sekiguchi et al. | 365/149 |
| 2012/0032242 | A1* | 2/2012 | Aoki | H01L 27/10814 257/296 |

FOREIGN PATENT DOCUMENTS

| JP | 10-284494 A | 10/1998 |
| JP | 2002-353334 A | 12/2002 |

* cited by examiner

*Primary Examiner* — Richard Elms
*Assistant Examiner* — Mohammed A Bashar
(74) *Attorney, Agent, or Firm* — McGinn IP Law Group, PLLC.

(57) ABSTRACT

Provided is a semiconductor device including: a memory cell array including a plurality of memory cells disposed in a matrix; and a peripheral circuit adjacent to the memory cell array. Each of the memory cells includes: a capacitive element including a lower electrode having a cylinder shape extending in a direction perpendicular to a principal surface of a substrate; and a switch transistor provided between the capacitive element and a bit line, turning on/off of the switch transistor being controlled based on a potential of a word line. The peripheral circuit includes a signal line that is adjacent to the lower electrode in a horizontal direction parallel to the principal surface and is supplied with a fixed potential, or a pair of signal lines respectively supplied with complementary potentials.

21 Claims, 19 Drawing Sheets

SEMICONDUCTOR DEVICE

CROSS-REFERENCE TO RELATED APPLICATIONS

This application is based upon and claims the benefit of priority from Japanese patent application No. 2014-097572, filed on May 9, 2014, the disclosure of which is incorporated herein in its entirety by reference.

BACKGROUND

The present invention relates to a semiconductor device, and more particularly, to a semiconductor device including, for example, a DRAM having a COM structure.

The structure of DRAM (Dynamic Random Access Memory) memory cells is divided into two types depending on the method of forming a capacitive element. One of the types is a trench type memory cell in which a capacitive element is buried in a trench formed in an Si substrate. The other type is a stack type memory cell in which a capacitive element is stacked on an upper layer of a transistor formed on a surface of an Si substrate. The structure of the stack type memory cell is roughly divided into two types, i.e., a CUB (Capacitor Under Bit-line) structure in which bit lines are located above a capacitive element, and a COB (Capacitor Over Bit-line) structure in which bit lines are located below a capacitive element (and are located above a transistor).

In the trench type memory cell, it is necessary to form a trench in the Si substrate in the vicinity of a transistor element and to bury a capacitive element in the trench. Thus, the shape of the trench type memory cell is complicated. Further, before the capacitive element is buried in the trench after formation of a cell capacitive film in the trench, heat treatment for forming a transistor is carried out, which makes it difficult to stabilize the characteristics of the capacitive element.

In the stack type memory cell, the sectional area of the capacitive element in the lateral direction (in the horizontal direction parallel to the principal surface of the substrate) has been decreasing as the cell area has been reduced in accordance with the demand for high integration of memory cells. To offset the reduced area, the length of the capacitive element in the longitudinal direction (in the direction perpendicular to the principal surface of the substrate) has been increasing. Thus, the capacitive element having a sufficiently large capacitance value can be secured.

At this time, in the memory cells having the CUB structure, the height of a contact that connects a cell transistor, which is formed on the surface of the Si substrate, to a bit line located above the capacitive element increases, which results in an increase in parasitic capacitance to be added to the bit line. Therefore, there is a limitation in increasing the length of the capacitive element in the longitudinal direction. In view of this, the memory cells having the COB structure as disclosed in, for example, Japanese Unexamined Patent Application Publication No. 2002-353334, have recently become mainstream.

During a process in which a transistor is formed on a surface of an Si substrate and a lower electrode of a capacitive element having a cylinder shape is then formed in a memory cell array area, no metal line is formed in a CMOS logic area (peripheral circuit area) in the vicinity of the memory cell array having the COB structure, while the area is filled with insulators. The metal line is disposed in a subsequent process. Accordingly, the height of a contact that connects the transistor to the metal line increases, which results in an increase in parasitic capacitance to be added to the metal line. Due to the effect of such an increase in parasitic capacitance, a delay deterioration in logic circuits in the peripheral circuit area is not negligible.

To solve such a problem, memory cells having a COM (Capacitor Over Metal) structure which is a developed form of the COB structure have recently been put into practical use. The term "COM structure" herein used refers to a structure in which a lower electrode of a capacitive element having a cylinder shape is embedded in a part of a plurality of metal line layers formed in an upper layer. In the COM structure, the metal lines are provided so as to be adjacent to the lower electrode of the capacitive element in the horizontal direction (in the direction parallel to the principal surface of the substrate).

In the COM structure, there is no need to increase the height of the area from the transistor in the peripheral circuit area to the metal line layer so that the height becomes equal to the height of the capacitive element. Accordingly, it is considered that the COM structure is effective as a structure that secures the capacitance value of each memory cell and prevents deterioration in transistor performance, and thus the COM structure will become mainstream in the future.

In addition, Japanese Unexamined Patent Application Publication No. H10-284494 discloses a technique in which a polysilicon film is disposed along a boundary portion between a memory cell array and peripheral circuits, to thereby reduce a difference in the height between the memory cell array and peripheral circuits at the boundary portion.

SUMMARY

In a DRAM including a memory cell array having a COM structure, data retention characteristics of each memory cell deteriorate due to the effect of a parasitic capacitance generated between a lower electrode of a capacitive element having a cylinder shape in a memory cell array area, and a metal line formed in a peripheral circuit area adjacent to the lower electrode in the horizontal direction. This results in a problem that a malfunction occurs. Other problems to be solved and novel features of the present invention will become apparent from the following description and the accompanying drawings.

A first aspect of the present invention is a semiconductor device including: a memory cell array including a plurality of memory cells disposed in a matrix; and a peripheral circuit adjacent to the memory cell array. Each of the memory cells includes: a capacitive element including a lower electrode having a cylinder shape extending in a direction perpendicular to a principal surface of a substrate; and a switch transistor provided between the capacitive element and a bit line, turning on/off of the switch transistor being controlled based on a potential of a word line. The peripheral circuit includes a signal line that is adjacent to the lower electrode in a horizontal direction parallel to the principal surface and is supplied with a fixed potential, or a pair of signal lines respectively supplied with complementary potentials.

According to the above-mentioned aspect of the present invention, it is possible to provide a semiconductor device capable of preventing occurrence of a malfunction by reducing the effect of noise from peripheral circuits.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

<Inventor's Preliminary Study>

Prior to detailed description of embodiments, the contents of the preliminary study by the present inventor will be described.

Figure 18:
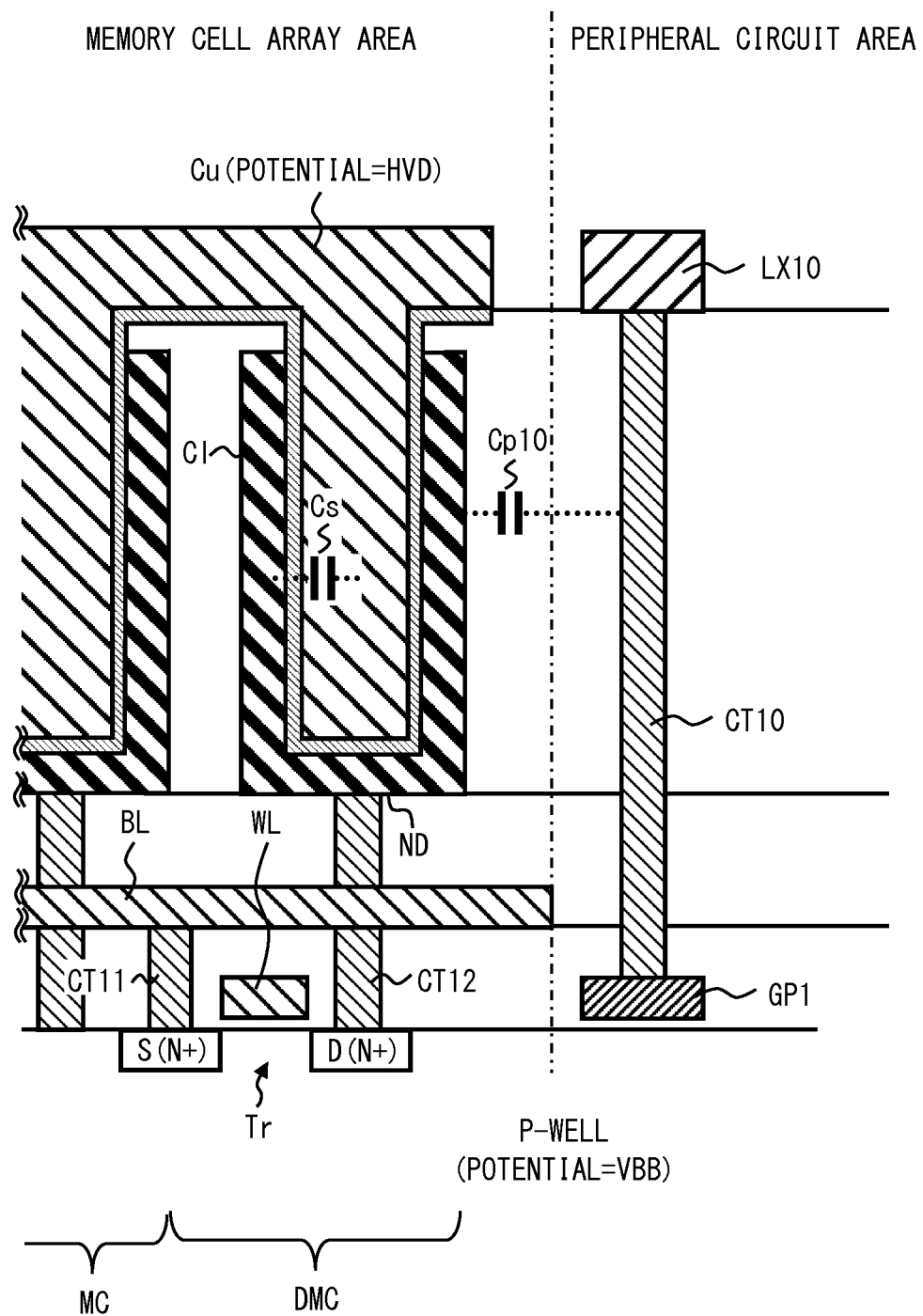
FIG. 18 is a sectional schematic view showing the vicinity of a boundary between a memory cell array having a COB structure and peripheral circuits thereof.

FIG. 18 is a sectional schematic view showing the vicinity of a boundary between a memory cell array having a COB structure and peripheral circuits thereof. In a memory cell array area, a plurality of memory cells MC are provided in a matrix and a plurality of dummy memory cells DMC having the same structure as that of the memory cells are provided so as to surround the outer periphery of the memory cells.

As shown in FIG. 18, in the memory cell array area, the dummy memory cell DMC is disposed on the outermost periphery of the memory cell array. In the dummy memory cell DMC, a word line WL and a bit line BL are disposed above a transistor Tr, which is formed on a surface of an Si substrate, and a capacitive element Cs is provided above the word line WL and the bit line BL.

More specifically, in the dummy memory cell DMC, two $N^+$ diffusion layers S and D are formed in a P-well of the Si substrate. A gate insulating film (not shown) and a gate electrode are sequentially formed above the P-well between the two $N^+$ diffusion layers S and D. This gate electrode is a part of the word line WL. Thus, the transistor Tr is formed on the surface of the Si substrate. The $N^+$ diffusion layer S is connected to the bit line BL through a contact CT11. On the other hand, the $N^+$ diffusion layer D is connected to one electrode (hereinafter referred to as "lower electrode") Cl of the capacitive element Cs, which is formed above the bit line BL, through a contact CT12. The lower electrode Cl has a cylinder shape that extends along the direction perpendicular to the principal surface of the substrate and has an opening facing in the vertical direction. As the other electrode of the capacitive element Cs, a cell plate electrode (hereinafter also referred to as "upper electrode") Cu which is shared between the other dummy memory cells DMC and memory cells MC is disposed so as to be opposed to the lower electrode Cl with a capacitive insulating film interposed therebetween.

The P-well is supplied with a potential VBB (a potential in a range from a ground voltage GND to a negative voltage VKK). The upper electrode Cu of the capacitive element Cs is supplied with an intermediate potential HVD (=VDD/2) which is about one-half of a power supply voltage VDD.

During a process in which a transistor (only a gate polysilicon line GP1 is shown) is formed on the surface of the Si substrate in the vicinity of the boundary between the memory cell array area and a peripheral circuit area and the lower electrode Cl is then formed in the memory cell array area, no metal line is formed in the peripheral circuit area, while the area is filled with insulators. In a subsequent process, a contact CT10 is formed and a metal line LX10 is disposed. In this case, the contact CT10 is disposed between the transistor (the gate polysilicon line GP1 in this case) and the metal line LX10.

Figure 19:
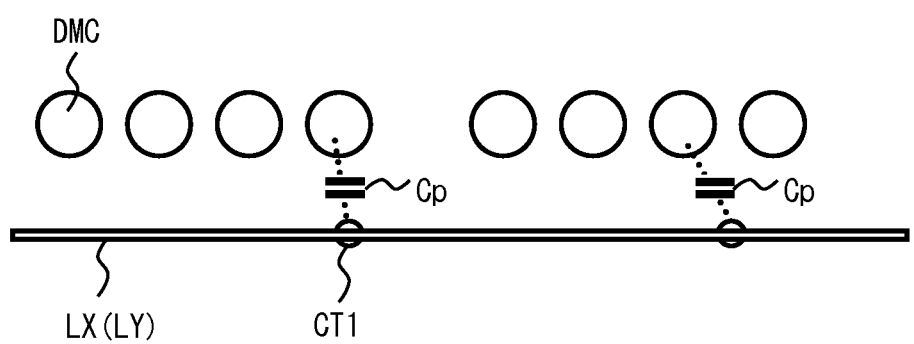
FIG. 19 is a plan view showing an arrangement relationship between a plurality of dummy memory cells and a metal line.

FIG. 19 is a plan view showing an arrangement relationship between a plurality of dummy memory cells and a metal line.

Referring to FIG. 19, the plurality of dummy memory cells DMC are disposed along the outer periphery of the memory cell array, and the metal line LX10 is disposed so as to be parallel and adjacent to the dummy memory cells.

In this case, since the metal line LX10 is disposed above the lower electrode Cl, no parasitic capacitance is formed between the lower electrode Cl and the metal line LX10. Accordingly, the metal line LX10 has no effect on data retention characteristics of each memory cell MC. On the other hand, the contact CT10 is formed in the insulating film in which the lower electrode Cl is formed, or in a layer having the same height as that of the layer in which the lower electrode Cl is formed. In other words, the contact CT10 is disposed so as to be adjacent to the lower electrode Cl in the horizontal direction. However, the number of contacts CT10 to be connected to the metal line LX10 is extremely small. Therefore, a parasitic capacitance Cp10 to be formed between the lower electrode Cl and the contact CT10 has little effect on the data retention characteristics of each memory cell MC.

However, the height of each contact CT10 has been increased so as to increase the capacitance value of the capacitive element Cs. This results in an increase in parasitic capacitance to be added to the metal line LX10. Due to the effect of such an increase in parasitic capacitance, a delay deterioration in logic circuits in the peripheral circuit area is not negligible. In view of this, memory cells having a COM structure, which is a developed form of the COB structure, have been put into practical use, as described above.

Figure 20:
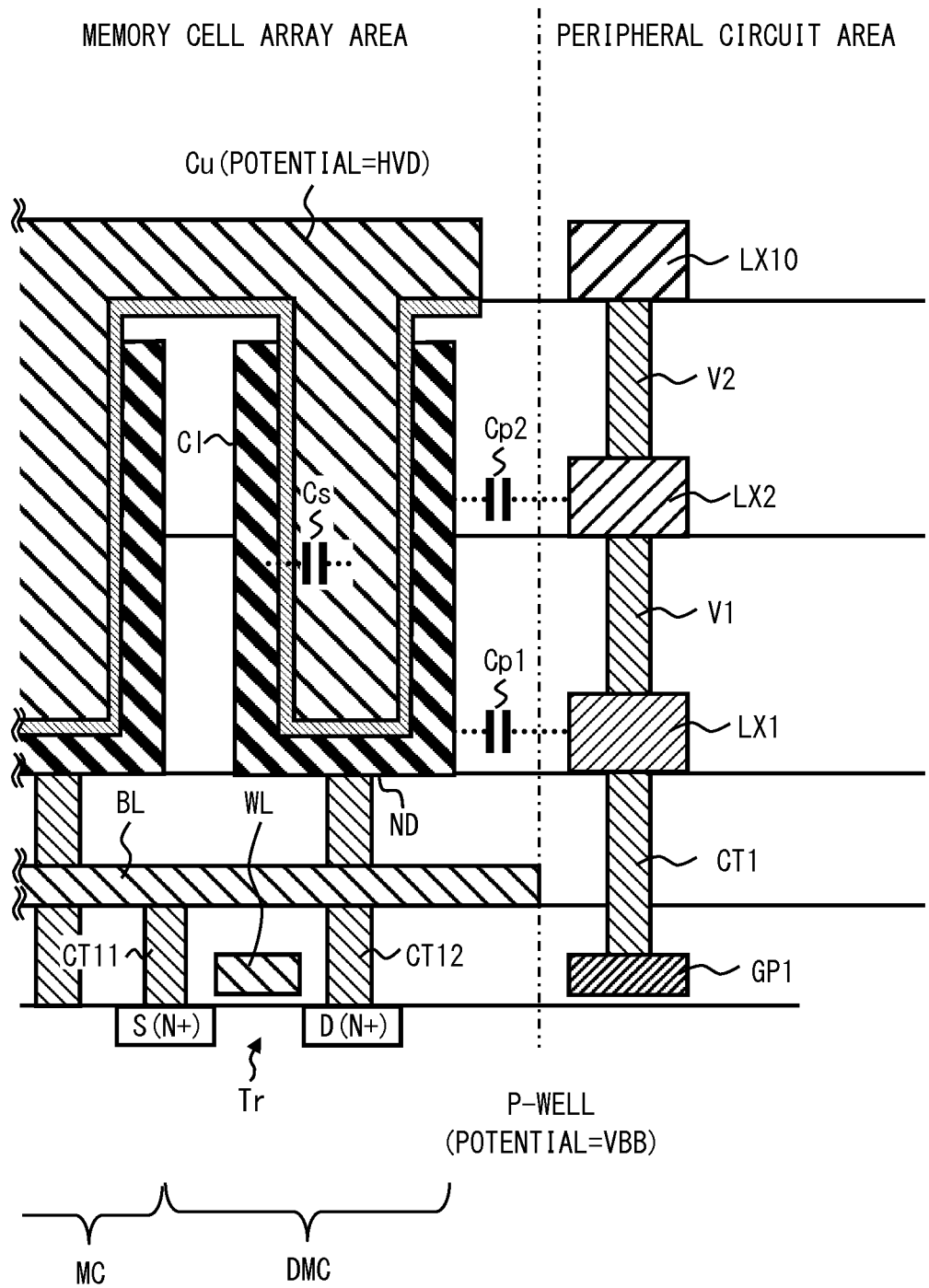
FIG. 20 is a sectional schematic view showing the vicinity of a boundary between a memory cell array having a COM structure and peripheral circuits thereof.

FIG. 20 is a sectional schematic view showing the vicinity of a boundary between the memory cell array having the COM structure and the peripheral circuits thereof. Since the structure of the memory cell array area is similar to that in the COB structure shown in FIG. 18, the description thereof is omitted.

In the peripheral circuit area, the transistor (only the gate polysilicon line GP1 is shown) is formed on the surface of the Si substrate in the vicinity of the boundary between the memory cell array area and the peripheral circuit area. After that, during a process in which the lower electrode Cl is formed in the memory cell array area, a plurality of insulating films are stacked and metal lines LX1 and LX2 are sequentially disposed in each insulating film. Specifically, the lower electrode Cl is formed so as to penetrate through the plurality of insulating films, and the metal lines LX1 and LX2 are formed in each of the plurality of insulating films. In another alternative, the metal lines LX1 and LX2 are formed in a layer having the same height as that of the layer in which the lower electrode Cl is formed. In other words, the metal lines LX1 and LX2 are disposed so as to be adjacent to the lower electrode Cl in the horizontal direction. The metal line LX10 is disposed in a subsequent process. The gate polysilicon line GP1 and the metal line LX1 are connected to each other through a contact CT1. The metal lines LX1 and LX2 are connected to each other through a via hole V1. The metal lines LX2 and LX10 are connected to each other through a via hole V2. In this embodiment, the metal lines LX1, LX2, and LX10 are each disposed along the plurality of dummy memory cells DMC.

In this case, since the metal line LX10 is disposed above the lower electrode Cl, no parasitic capacitance is formed between the lower electrode Cl and the metal line LX10. Accordingly, the metal line LX10 has no effect on the data retention characteristics of each memory cell MC. The number of the contacts CT1 and via holes V1 and V2 which are connected between the metal lines LX1, LX2, and LX10 is extremely small. Therefore, the parasitic capacitance formed between the lower electrode Cl and the contact CT1 and via holes V1 and V2 has little effect on the data retention characteristics of each memory cell MC.

On the other hand, the metal lines LX1 and LX2 are disposed in a layer having the same height as that of the layer formed in which the lower electrode Cl is formed. In other words, the metal lines LX1 and LX2 are disposed so as to be adjacent to the lower electrode Cl in the horizontal direction. Accordingly, a parasitic capacitance Cp1 is formed between the lower electrode Cl and the metal line LX1, and a parasitic capacitance Cp2 is formed between the lower electrode Cl and the metal line LX2.

When the parasitic capacitances Cp1 and Cp2 are formed, a potential Vn of a storage node ND of each dummy memory cell DMC changes in accordance with a change in the potential of the metal lines LX1 and LX2. In this case, the storage node ND of each dummy memory cell DMC corresponds to the lower electrode Cl having a cylinder shape. A change in the potential Vn of the storage node ND of each dummy memory cell DMC propagates to each memory cell MC as noise, which deteriorates the retention characteristics of data stored in each memory cell MC. As a result, a malfunction may occur in a DRAM. Even if there is no possibility that data corruption occurs, it is necessary to conduct an additional test in the worst state in which the effect of a potential change of the metal lines, such as the metal lines LX1 and LX2, which are disposed so as to be adjacent to the lower electrode Cl in the horizontal direction, is taken into consideration. This leads to an increase in cost. These problems are not caused in the memory cells having the COB structure, but are conspicuous in the memory cells having the COM structure.

Embodiments of the present invention will be described below with reference to the accompanying drawings. Note that the drawings are in simplified form, and the technical scope of the present invention should not be interpreted to be limited to the drawings. The same elements are denoted by the same reference numerals, and a duplicate description is omitted.

In the following embodiments, when necessary, the present invention is explained by using separate sections or separate embodiments. However, those embodiments are not unrelated with each other, unless otherwise specified. That is, they are related in such a manner that one embodiment is a modified example, an application example, a detailed example, or a supplementary example of a part or the whole of another embodiment. Further, in the following embodiments, when the number of elements or the like (including numbers, values, quantities, ranges, and the like) is mentioned, the number is not limited to that specific number except for cases where the number is explicitly specified or the number is obviously limited to a specific number based on its principle. That is, a larger number or a smaller number than the specific number may also be used.

Further, in the following embodiments, the components (including operation steps and the like) are not necessarily indispensable except for cases where the component is explicitly specified or the component is obviously indispensable based on its principle. Similarly, in the following embodiments, when a shape, a position relation, or the like of a component(s) or the like is mentioned, shapes or the like that are substantially similar to or resemble that shape are also included in that shape except for cases where it is explicitly specified or they are eliminated based on its principle. This is also true for the above-described number or the like (including numbers, values, quantities, ranges, and the like).

<First Embodiment>

Figure 1:
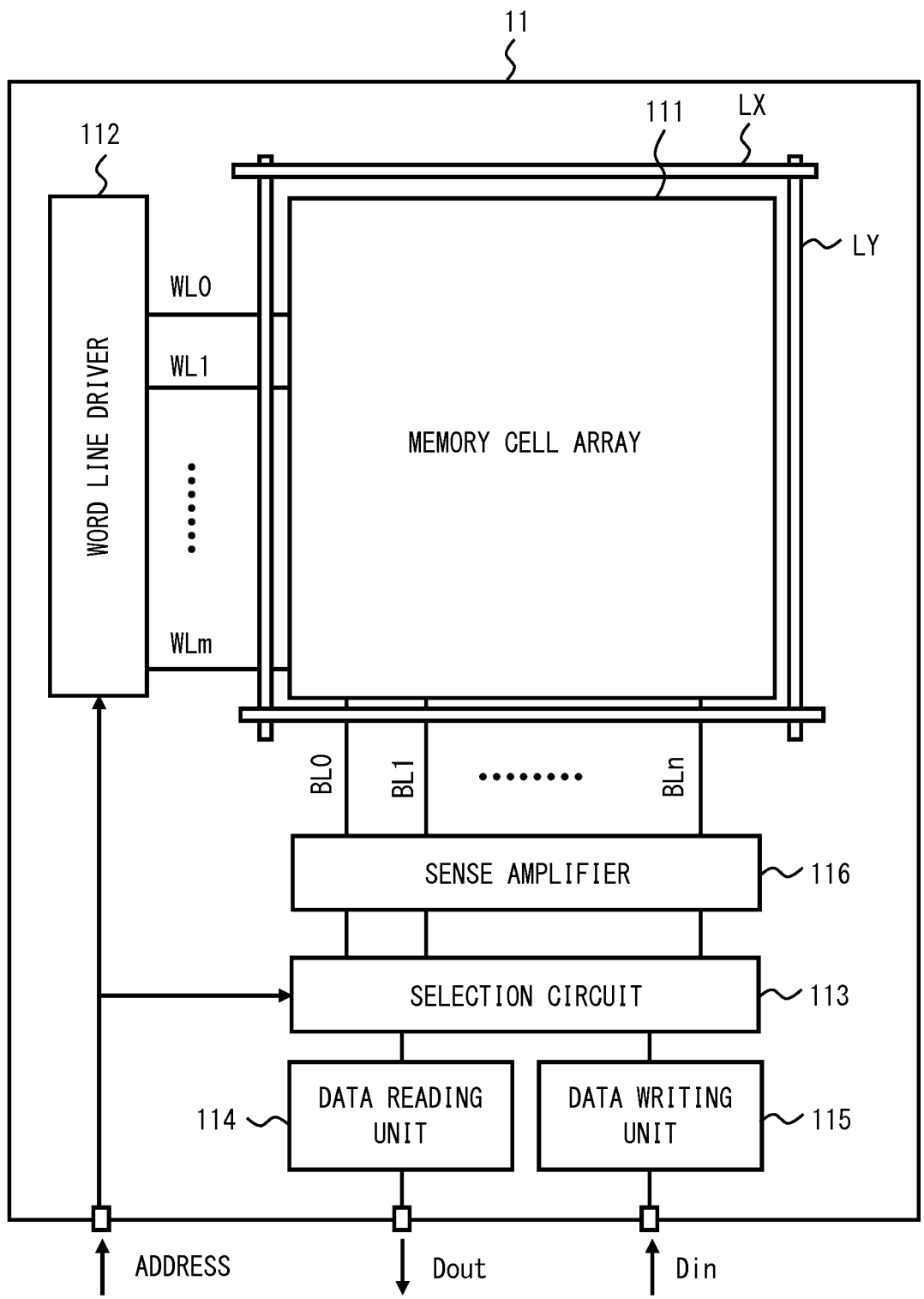
FIG. 1 is a block diagram showing a DRAM according to a first embodiment.

FIG. 1 is a block diagram showing a configuration example of a DRAM (semiconductor device) 11 according to a first embodiment. In the DRAM 11, peripheral circuits adjacent to a memory cell array area include signal lines which are supplied with a fixed potential and are adjacent to a lower electrode of a capacitive element of a memory cell in the horizontal direction. This configuration enables the DRAM 11 to reduce the effect of noise from the peripheral circuits and prevent occurrence of a malfunction. This configuration will be described in detail below.

As shown in FIG. 1, the DRAM 11 includes a memory cell array 111, a word line driver 112, a sense amplifier unit 116, a selection circuit 113, a data reading unit 114, and a data writing unit 115. Metal lines LX and LY are disposed so as to surround the memory cell array 111.

Figure 2:
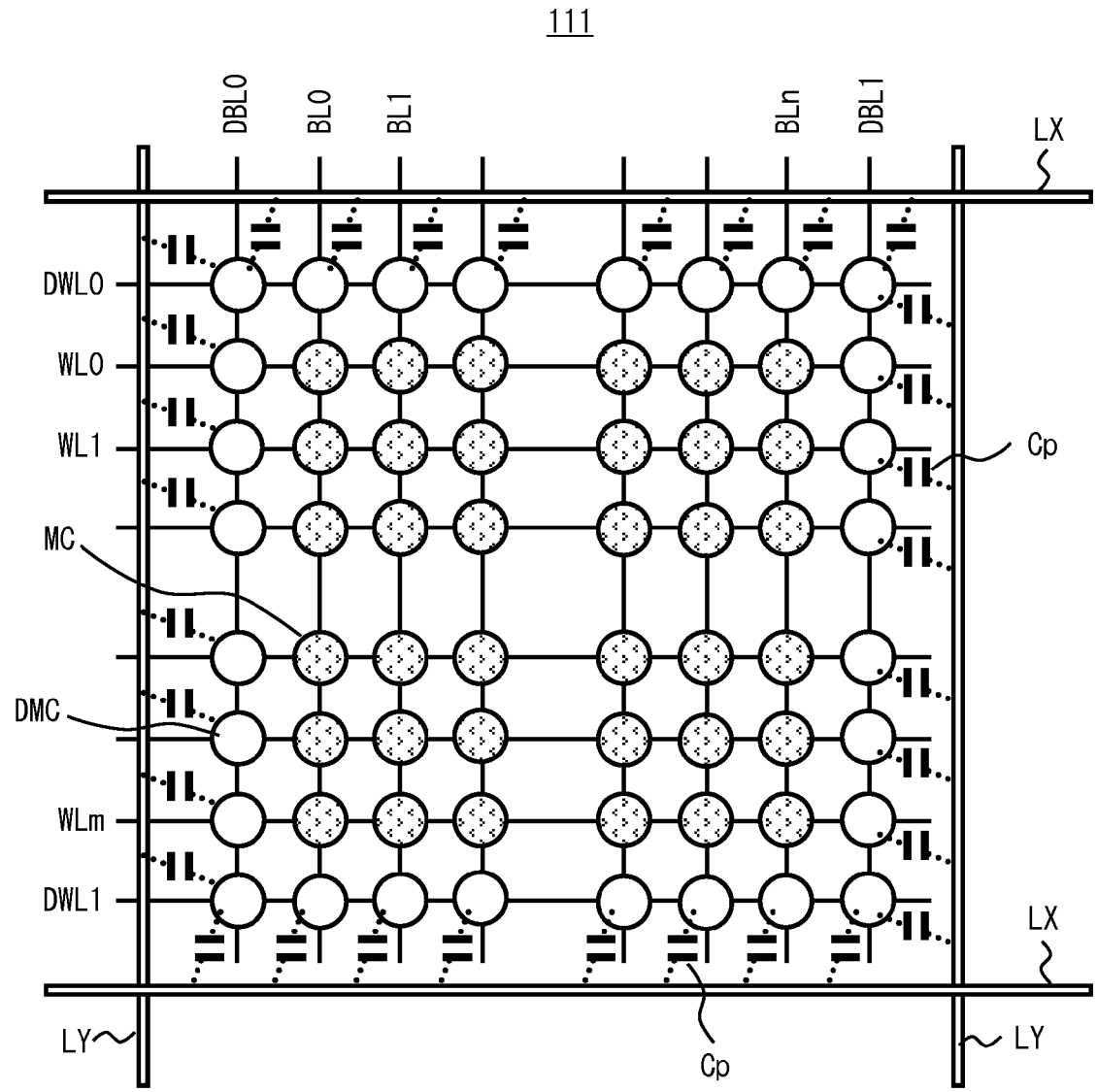
FIG. 2 is a plan view showing a memory cell array.

FIG. 2 is a plan view showing a detailed configuration of the memory cell array 11.

Referring to FIG. 2, the memory cell array 111 includes a plurality of memory cells MC, which are disposed in a matrix, and a plurality of dummy memory cells DMC which have the same structure as that of the memory cells MC and are provided so as to surround the outer periphery of the memory cells MC.

Each of a plurality of word lines WL0 to WLm (m is a natural number) is provided for each row of the plurality of memory cells MC. Each of a plurality of bit lines BL0 to BLn (n is a natural number) is provided for each column of the plurality of memory cells MC. A dummy word line DWL0 is provided for the plurality of dummy memory cells DMC which are disposed so as to be adjacent to the plurality of memory cells MC located in the 0-th row. A dummy word line DWL1 is provided for the plurality of dummy memory cells DMC which are disposed so as to be adjacent to the plurality of memory cells MC located in the m-th row. A dummy bit line DBL0 is provided for the plurality of dummy memory cells DMC which are disposed so as to be adjacent to the plurality of memory cells MC located in the 0-th column. A dummy bit line DBL1 is provided for the plurality of dummy memory cells DMC which are disposed so as to be adjacent to the plurality of memory cells MC located in the n-th column.

Hereinafter, the word lines WL0 to WLm are collectively referred to as "word line WL"; the bit lines BL0 to BLn are collectively referred to as "bit line BL"; the dummy word lines DWL0 and DWL1 are collectively referred to as "dummy word line DWL"; and the dummy bit lines DBL0 and DBL1 are collectively referred to as "dummy bit line DBL".

Figure 3:
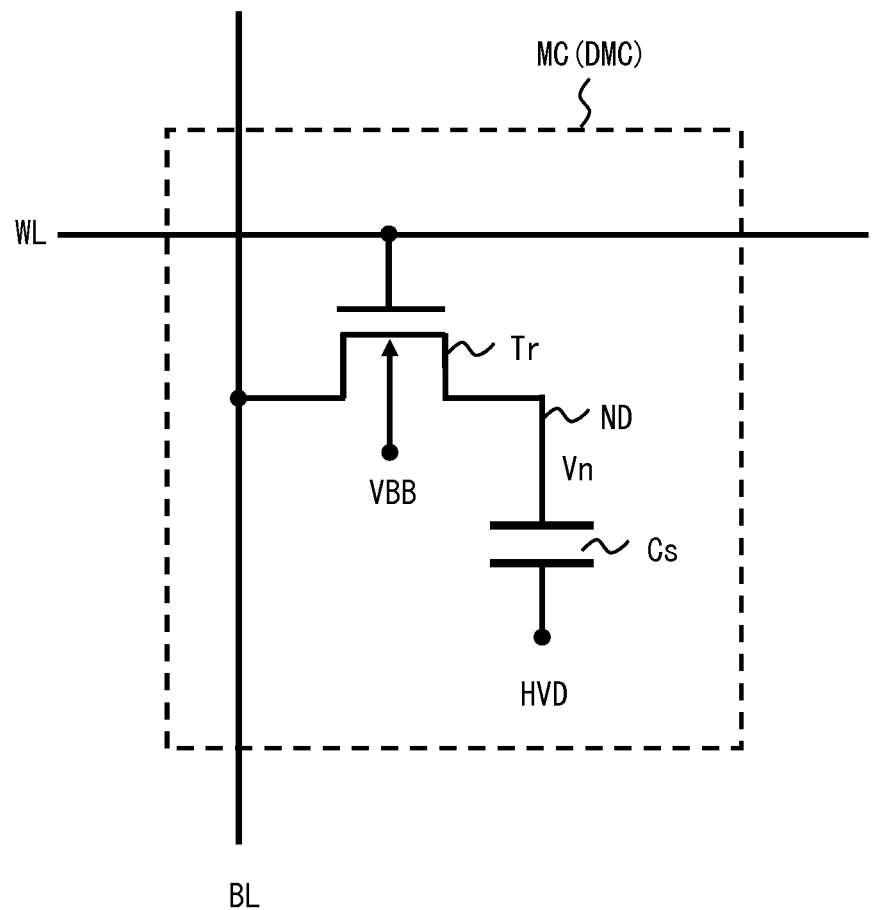
FIG. 3 is a circuit diagram showing a memory cell.

FIG. 3 is a circuit diagram showing the memory cell MC.

Referring to FIG. 3, the memory cell MC includes a capacitive element Cs and a transistor (switch transistor) Tr. The capacitive element Cs is provided between a storage node ND and a power supply terminal that is supplied with an intermediate potential HVD representing a value which is substantially one-half of a power supply voltage VDD. The transistor Tr is provided between the bit line BL and the storage node ND, and turning on/off of the transistor Tr is controlled based on the potential of the word line WL. The memory cell MC stores data "1" when a potential Vn of the storage node ND is set to the value of the power supply voltage VDD. The memory cell MC stores data "0" when the potential Vn of the storage node ND is set to the value of a ground voltage GND.

The word line driver 112 selects a word line designated by an address signal from among the plurality of word lines WL0 to WLm (m is a natural number) during data reading and data writing. Specifically, during data reading and data writing, the word line driver 112 sets the potential of the selected word line WL to a potential VPP that is higher than the power supply voltage VDD. The potential of each non-selected word line WL is set to a potential VKK that is lower than the ground voltage GND.

The sense amplifier unit 116 amplifies data propagating through the bit lines BL0 to BLn (n is a natural number), for example, data read out from the memory cell connected to the word line designated by the address signal.

During data reading, the selection circuit 113 selects a bit line designated by the address signal from among the plurality of bit lines BL0 to BLn (n is a natural number), and connects the selected bit line to the data reading unit 114. During data writing, the selection circuit 113 selects a bit line designated by the address signal from among the plurality of bit lines BL0 to BLn (n is a natural number), and connects the selected bit line to the data writing unit 115.

Accordingly, during data reading, the potential of the bit line BL selected by the selection circuit 113, that is, the amplified data read out from the memory cell MC to be read is supplied to the data reading unit 14. On the other hand, during data writing, the potential of the bit line BL selected by the selection circuit 113 is set to the value of the power supply voltage VDD or ground voltage GND according to the data to be written into the memory cell MC to be written.

The memory cell MC that is connected to both the word line WL, which is selected by the word line driver 112, and the bit line BL, which is selected by the selection circuit 113, is a memory cell to which data is written, or a memory cell from which data is read.

The data reading unit 114 reads data stored in the memory cell MC designated by the address signal, and outputs the read data as read data Dout.

The data writing unit 115 writes write data Din into the memory cell MC designated by the address signal.

Figure 4:
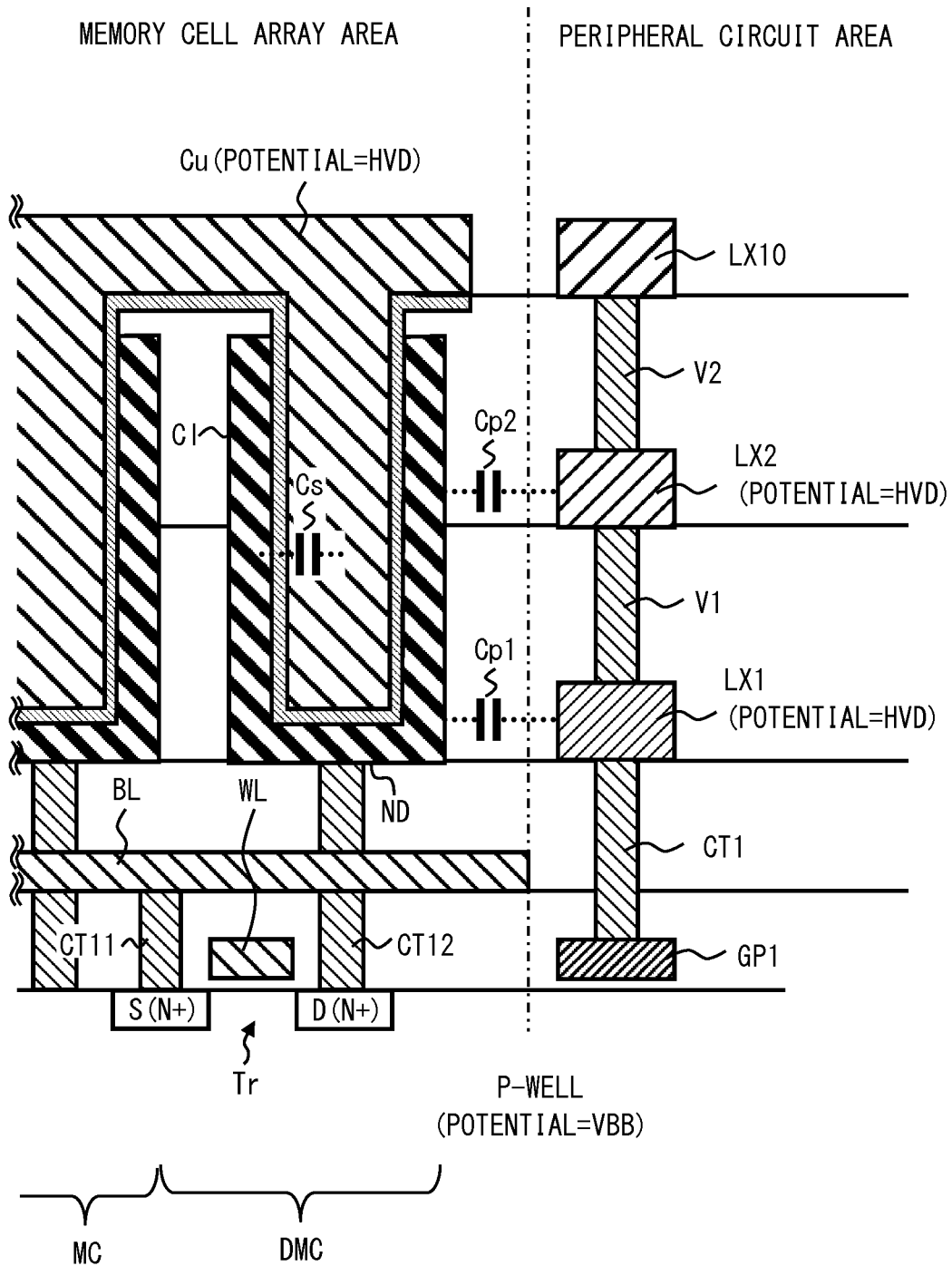
FIG. 4 is a sectional schematic view showing the vicinity of a boundary between a memory cell array, which has a COM structure and is provided in the DRAM shown in FIG. 1, and peripheral circuits thereof.

FIG. 4 is a sectional schematic view showing the vicinity of a boundary between the memory cell array 111, which is provided in the DRAM 11 and has the COM structure, and the peripheral circuits thereof. The term "peripheral circuits" used in this embodiment refers to circuits that drive the memory cell array 111. Examples of the peripheral circuits include the word line driver 112, the sense amplifier unit 116, the selection circuit 113, the data writing unit 115, and the data reading unit 114.

As shown in FIG. 4, metal lines LX1 and LX2 which constitute the metal line LX are lines provided in the peripheral circuit area adjacent to the memory cell array 111, and are supplied with a fixed potential. Specifically, the metal lines LX1 and LX2 are each supplied with the intermediate potential HVD. The other components are similar to those shown in FIG. 20, and thus the description thereof is omitted.

Referring to FIG. 2, the metal line LX formed of the metal lines LX1 and LX2 is disposed in parallel to the word line WL. More specifically, a certain metal line LX is disposed so as to be parallel or adjacent to the plurality of dummy memory cells DMC that share the dummy word line DWL1. Another metal line LX is disposed so as to be parallel and adjacent to the dummy memory cells DMC that share the dummy word line DWL0. On the other hand, the metal line LY (not shown in FIG. 4) which is formed of metal lines LY1 and LY2 having a layered structure similar to that of the metal lines LX1 and LX2 is disposed so as to be parallel to the bit line BL. More specifically, a certain metal line LY is disposed so as to be parallel and adjacent to the dummy memory cells DMC that share the dummy bit line DBL1. Another metal line LY is disposed so as to be parallel and adjacent to the dummy memory cells DMC that share the dummy bit line DBL0. The metal line LY is also supplied with the intermediate potential HVD, as with the metal line LX. In this manner, the metal lines LX and LY are disposed so as to surround the memory cell array 111.

In this case, since the metal line LX10 is disposed above the lower electrode Cl, no parasitic capacitance is formed between the lower electrode Cl and the metal line LX10. Accordingly, the metal line LX10 has no effect on the data retention characteristics of each memory cell MC. The number of the contacts CT1 and via holes V1 and V2 which are connected between the metal lines LX1, LX2, and LX10 is extremely small. Therefore, the parasitic capacitance formed between the lower electrode Cl and the contacts CT1 and via holes V1 and V2 has little effect on the data retention characteristics of each memory cell MC.

On the other hand, a parasitic capacitance Cp1 is formed between the lower electrode Cl and the metal line LX1, and a parasitic capacitance Cp2 is formed between the lower electrode Cl and the metal line LX2. However, since the potentials of the metal lines LX1 and LX2 are fixed, the potential Vn of the storage node ND of each dummy memory cell DMC does not change. Therefore, deterioration in the data retention characteristics of the memory cells MC adjacent to the dummy memory cells DMC can be suppressed.

Thus, in the DRAM 11, the peripheral circuits adjacent to the memory cell array 111 include the metal lines LX and LY which are adjacent to the lower electrode Cl of the capacitive element Cs of the memory cell MC and are supplied with a fixed potential. This configuration enables the DRAM 11 to reduce the effect of noise from the peripheral circuits and prevent occurrence of a malfunction.

Furthermore, an increase in refresh current associated with the deterioration in the data retention characteristics can be suppressed, and the necessity for an additional test in the worst state can be eliminated. Moreover, since it is only necessary to fix the potentials of the metal lines LX and LY, an increase in the circuit size and an increase in the level of design difficulty can be reduced to a negligible level.

(Mechanism of Noise Propagation)

Subsequently, the mechanism of noise propagation from the metal lines LX and LY to the memory cells MC will be described in detail.

Figure 5:
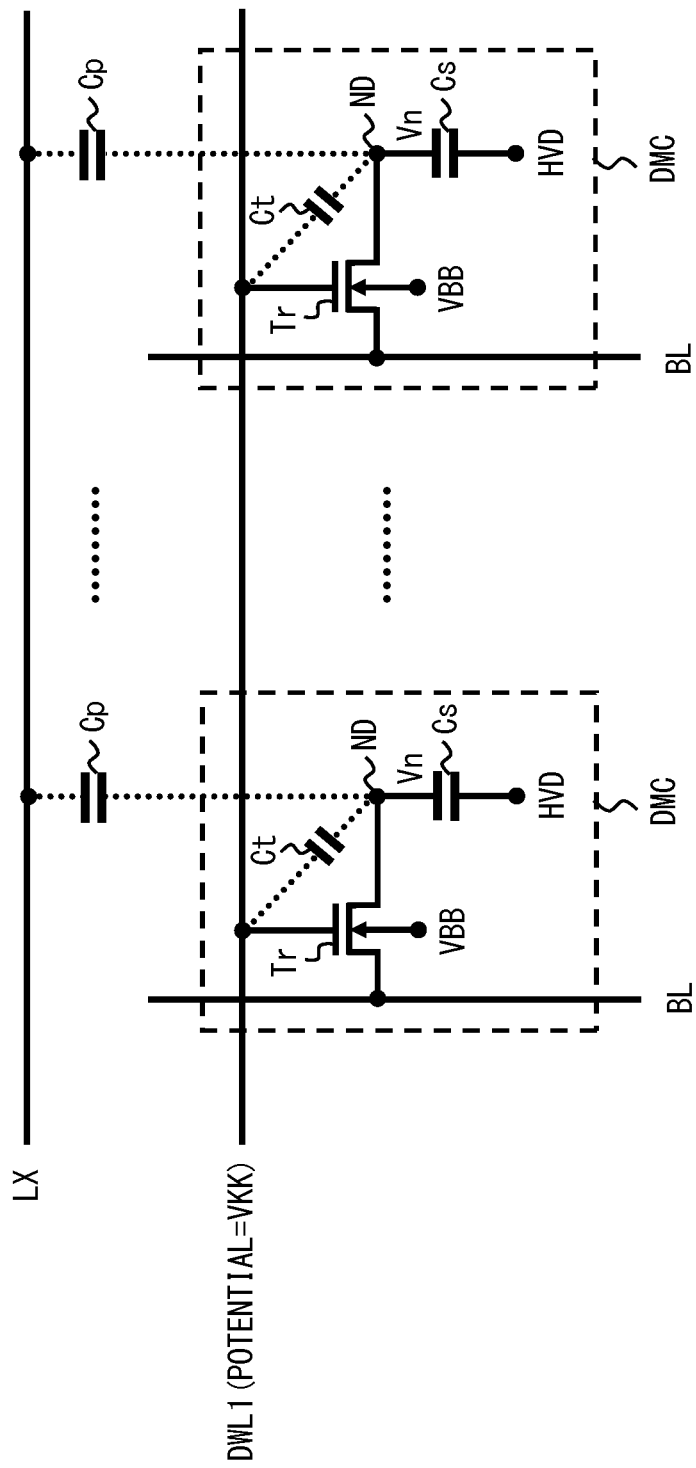
FIG. 5 is a circuit diagram showing a plurality of dummy memory cells disposed in a word line direction, and a metal line disposed so as to be adjacent and parallel to the dummy memory cells.

FIG. 5 is a circuit diagram showing the plurality of dummy memory cells DMC, which are disposed in a word line direction, and the metal line (hereinafter also referred to as "signal line") LX disposed so as to be parallel and adjacent to the dummy memory cells DMC.

As shown in FIG. 5, the signal line LX is connected to the storage node ND of each dummy memory cell DMC through a parasitic capacitance Cp. A parasitic capacitance Ct is formed between the dummy word line DWL1 and the storage node ND.

The potential of the dummy word line DWL1 provided for the plurality of dummy memory cells DMC is set to the potential VKK which is lower than the ground voltage GND. Thus, the plurality of dummy memory cells DMC are in the non-selected state. In each dummy memory cell DMC, the capacitive element Cs is supplied with the intermediate potential HVD, as with the memory cell MC, and the back gate of the transistor Tr is supplied with a voltage VBB.

Figure 6:
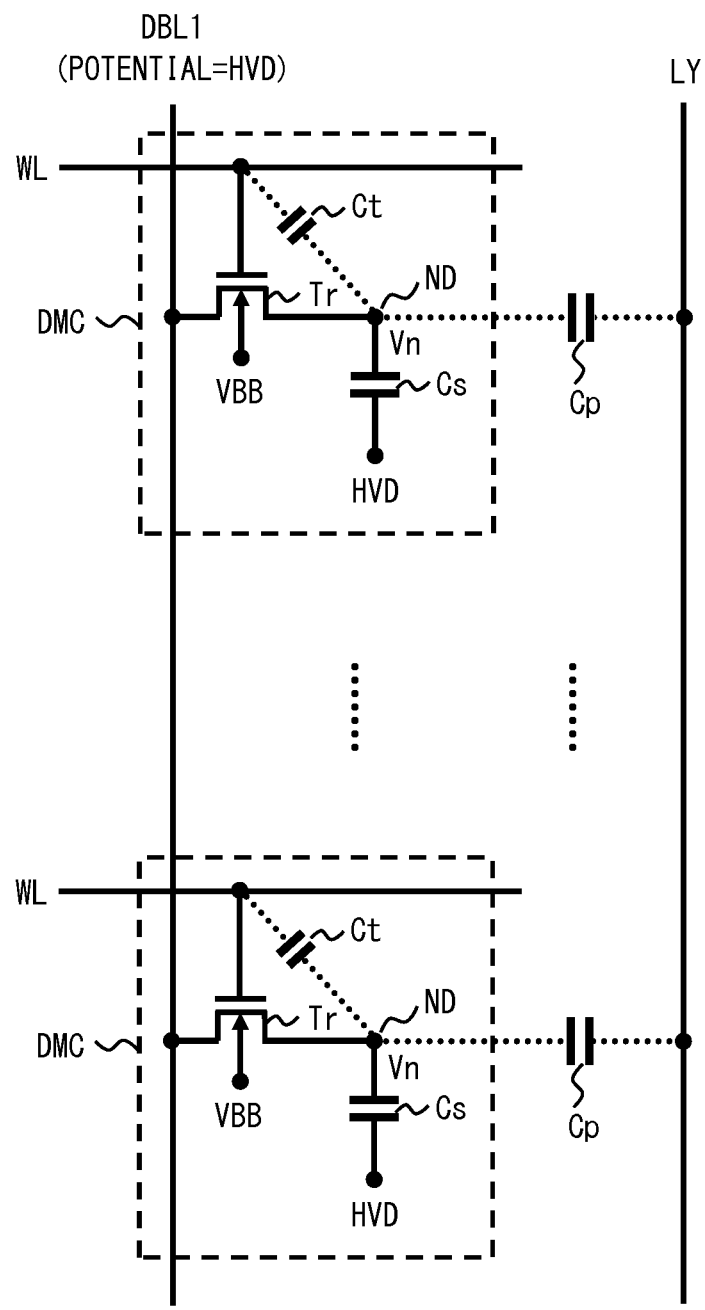
FIG. 6 is a circuit diagram showing a plurality of dummy memory cells disposed in a bit line direction, and a metal line disposed so as to be adjacent and parallel to the dummy memory cells.

FIG. 6 is a circuit diagram showing the plurality of dummy memory cells DMC, which are disposed in a bit line direction, and the metal line (hereinafter also referred to as "signal line") LY disposed so as to be parallel and adjacent to the dummy memory cells DMC.

As shown in FIG. 6, the signal line LY is connected to the storage node ND of each dummy memory cell DMC through the parasitic capacitance Cp. The parasitic capacitance Ct is formed between the word line WL and the storage node ND.

The potentials of most of the plurality of word lines WL connected to the plurality of dummy memory cells DMC are set to the potential VKK which is lower than the ground voltage GND. The potential of the dummy bit line DBL1 provided for the plurality of dummy memory cells DMC is set to the intermediate potential HVD, as with the non-selected bit lines BL. In the dummy memory cells DMC, the capacitive element Cs is supplied with the intermediate potential HVD and the back gate of the transistor Tr is supplied with the voltage VBB, as in the memory cells MC.

Figure 7:
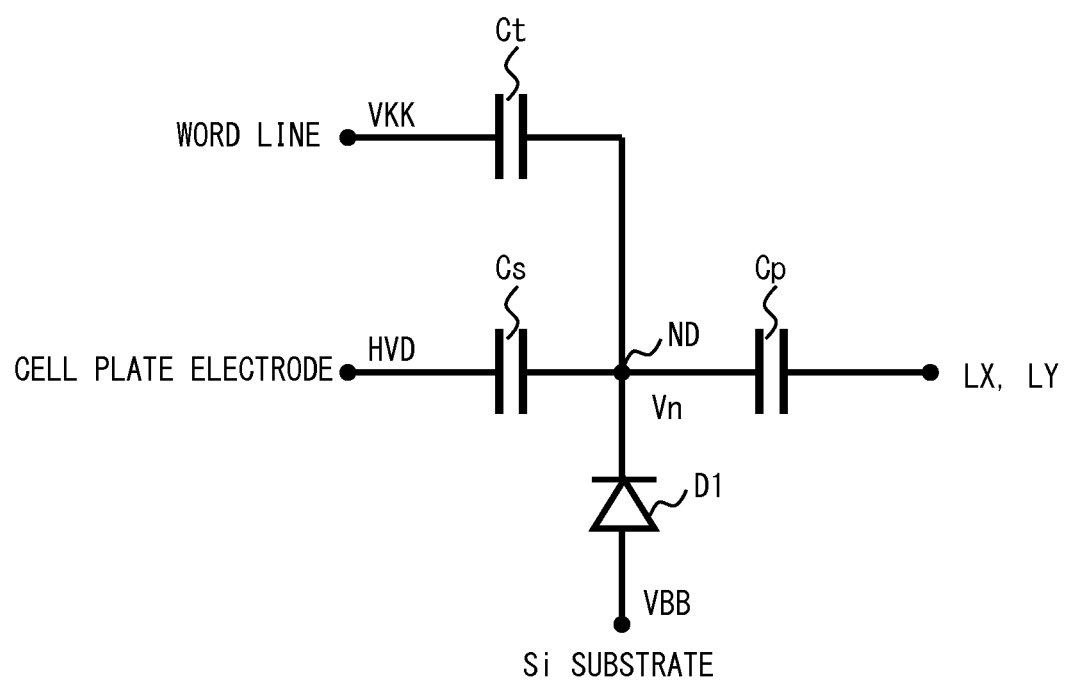
FIG. 7 shows an equivalent circuit of the dummy memory cells shown in FIGS. 5 and 6.

FIG. 7 is an equivalent circuit of the dummy memory cells DMC shown in FIGS. 5 and 6.

As shown in FIG. 7, the parasitic capacitance Cp is formed between the storage node ND and the signal line LX (or LY). The parasitic capacitance Ct is formed between the storage node ND and the word line (the dummy word line DWL1 or the non-selected word line WL) representing the potential VKK. The capacitive element Cs is formed between the storage node ND and a cell plate electrode (upper electrode) Cu representing the potential HVD. A PN junction diode D1 that connects the Si substrate (P-well) to the storage node ND ($N^+$ diffusion layer) in the forward direction is formed between the storage node ND and the Si substrate representing the potential VBB.

In this case, noise which has propagated from the signal line LX or LY to the storage node ND may propagate through three paths. A first path is a path from the storage node ND to the cell plate electrode (upper electrode) Cu through the capacitive element Cs. A second path is a path from the storage node ND to the word line (the dummy word line DWL1 or the non-selected word lines WL) through the parasitic capacitance Ct. A third path is a path from the storage node ND to the Si substrate through the diode D1.

If the potential of the signal line LX (or LY) changes, the potential Vn of the storage node ND of each dummy memory cell DMC also changes in accordance with the change in the potential of the signal line. Accordingly, the noise propagates through the first path, so that the potential HVD of the cell plate electrode Cu changes. Since the cell plate electrode Cu is shared by the memory cells MC, the change in the potential HVD of the cell plate electrode Cu causes the potential of the storage node of each memory cell MC to fluctuate. In other words, the change in the potential HVD of the cell plate electrode Cu deteriorates the data retention characteristics of each memory cell MC. Furthermore, the noise propagates through the second path, so that the potential VKK of the dummy word line DWL1 or non-selected word line WL changes. The dummy word line DWL1 shares a power supply with the non-selected word lines WL. The non-selected word lines WL are shared by the memory cells MC. Accordingly, a change in the potential VKK of the dummy word line DWL1 or non-selected word lines WL causes the gate potential of the transistor of each memory cell MC to fluctuate. As a result, the amount of off-leak current of each transistor instantaneously increases, which causes an electric charge accumulated in the storage node to be discharged. In other words, the data retention characteristics of each memory cell MC deteriorate.

Moreover, in the third path, in a case where the potential Vn of the storage node ND of the dummy memory cell DMC indicates a value between the ground voltage GND and the Si substrate voltage VBB, if noise occurs on the negative side of the signal lines LX and LY, the PN junction diode D1 instantaneously turns on, so that a current flows from the Si substrate to the storage node ND. Since the P-well supplied with the voltage VBB has a high resistance, a carrier injected into the P-well is absorbed in the $N^+$ diffusion layer of the adjacent memory cell MC. This causes a potential change of the storage node of the memory cell MC. In other words, the data retention characteristics of each memory cell MC deteriorate.

As described above, if the potential of the signal line LX or LY changes, the potential Vn of the storage node ND of each dummy memory cell DMC changes in accordance with the change in the potential of the signal line. The change in the potential Vn of the storage node ND of each dummy memory cell DMC propagates through the three paths as noise, which deteriorates the data retention characteristics of each memory cell MC. Such a phenomenon is conspicuous particularly when the potentials Vn of the storage nodes ND of the plurality of dummy memory cells DMC surrounding the plurality of memory cells MC disposed in a matrix are concurrently changed.

Thus, the DRAM 11 includes, as a part of the peripheral circuits adjacent to the memory cell array 111, the metal lines LX and LY that are adjacent to the lower electrode Cl of the capacitive element Cs in the horizontal direction and are supplied with a fixed potential. Since the potentials of the metal lines LX and LY are fixed, the potential Vn of the storage node ND of each dummy memory cell DMC does not change. Accordingly, the noise is prevented from propagating to the memory cells MC through the three paths extending from the storage nodes ND. Therefore, deterioration in the data retention characteristics of each memory cell MC can be suppressed. As a result, the DRAM 11 can prevent occurrence of a malfunction.

The arrangement of the metal lines LX and LY so as to be parallel and adjacent to the plurality of dummy memory cells DMC disposed along the outer periphery of the memory cell array 111 can prevent the potentials Vn of the storage nodes ND of the plurality of dummy memory cells DMC from being concurrently changed. Consequently, deterioration in the data retention characteristics of each memory cell MC can be more effectively suppressed.

In the case of the COB structure, the metal line that is adjacent to the lower electrode Cl in the horizontal direction is not provided. Contacts CT10 are provided so as to be adjacent to the lower electrode Cl, but the number of the contacts CT10 is small enough to neglect the effect of noise propagation. It is considered that this is one of the reasons that the effect of noise propagation has not been taken into consideration in the COM structure which is a developed form of the COB structure.

The dummy memory cells DMC have the same layout structure as that of the memory cells MC, but do not have the function of storing data. Therefore, it is considered that the dummy memory cells DMC function as a noise shield that shields the peripheral circuits from noise. However, the noise shield is not sufficient for the memory cells having the COM structure, as described above. The DRAM 11 reduces the effect of noise from the peripheral circuits on the memory cells having the COM structure, thereby effectively suppressing deterioration in the data retention characteristics of each memory cell MC.

While the first embodiment has illustrated an example in which the metal line layer adjacent to the lower electrode Cl in the horizontal direction has to layers, but the structure of the metal line layer is not limited thereto. The metal line layer adjacent to the lower electrode Cl in the horizontal direction may have one layer, or three or more layers.

The first embodiment has illustrated an example in which the metal lines adjacent to the lower electrode Cl in the horizontal direction are supplied with the intermediate potential HVD which is the same potential as that for the cell plate electrode (upper electrode) Cu. However, the potential to be supplied to the metal lines is not limited thereto. The metal lines adjacent to the lower electrode Cl in the horizontal direction may be supplied with any fixed potential. For example, a fixed potential such as the power supply voltage VDD, the ground voltage GND, the word line WL activating voltage VPP, the word line WL non-activating voltage VKK, or the substrate voltage VBB may be used. In this case, however, it is effective to supply the metal lines adjacent to the lower electrode Cl in the horizontal direction with the same intermediate potential HVD as that for the cell plate electrode (upper electrode) Cu, so that a noise phase difference can be reduced.

An intermediate potential generation circuit that supplies the metal lines LX and LY with the intermediate potential HVD is not necessarily the same as an intermediate potential generation circuit that supplies the cell plate electrode Cu with the intermediate potential HVD, but may be the same as an intermediate potential generation circuit that generates the intermediate potential HVD for precharging the bit lines. In this case, the arrangement of transistors connected to the metal lines LX and LY so as to form a precharge circuit makes it possible to suppress an increase in the circuit size while suppressing noise.

In the first embodiment, the metal line LX is connected to the gate polysilicon line GP1 of the transistor provided in the peripheral circuit area through the contact CT1. However, the configuration of the metal line LX is not limited thereto.

While the first embodiment has illustrated an example in which the metal lines LX1, LX2, and LX10 are connected to each other through the contacts V1 and V2, the metal lines LX1, LX2, and LX10 need not necessarily be connected. The arrangement of the metal lines LX1 and LX2 so as to be independent from each other, for example, makes it possible to supply the metal lines LX1 and LX2 with fixed potentials of different values.

The metal line LX, which is disposed in parallel to the word line WL, and the metal line LY, which is disposed in parallel to the bit line BL, need not necessarily be connected, as long as the metal lines are each supplied with a fixed potential. The arrangement of the metal lines LX and LY so as to be independent from each other, for example, makes it possible to supply the metal line LX with the ground voltage GND and supply the metal line LY with the power supply voltage VDD. In this case, these metal lines LX and LY can also be used as a part of a power supply line for peripheral circuits.

While the first embodiment has illustrated an example in which the metal lines adjacent to the lower electrode Cl in the horizontal direction are supplied with a fixed potential, the potential to be supplied to the metal lines is not limited thereto. For example, complementary potentials, such as differential signals, can be supplied to a pair of metal lines (for example, LX1 and LX2). This configuration makes it possible to cancel out noise from one of the pair of metal lines and noise from the other one of the pair of metal lines. In another alternative, complementary potentials may be supplied to a pair of metal lines. One of the pair of metal lines is disposed along one side of the outer periphery of the memory cell array 111, and the other one of the pair of metal lines is disposed along a side opposed to the one side. The signal lines through which logic signals propagate can be disposed so as to be adjacent to the memory cell array 111, which contributes to an improvement in the degree of freedom of design and suppression of an increase in the circuit size. Specific examples thereof will be briefly described below with reference to FIGS. 8 and 9.

Figure 8:
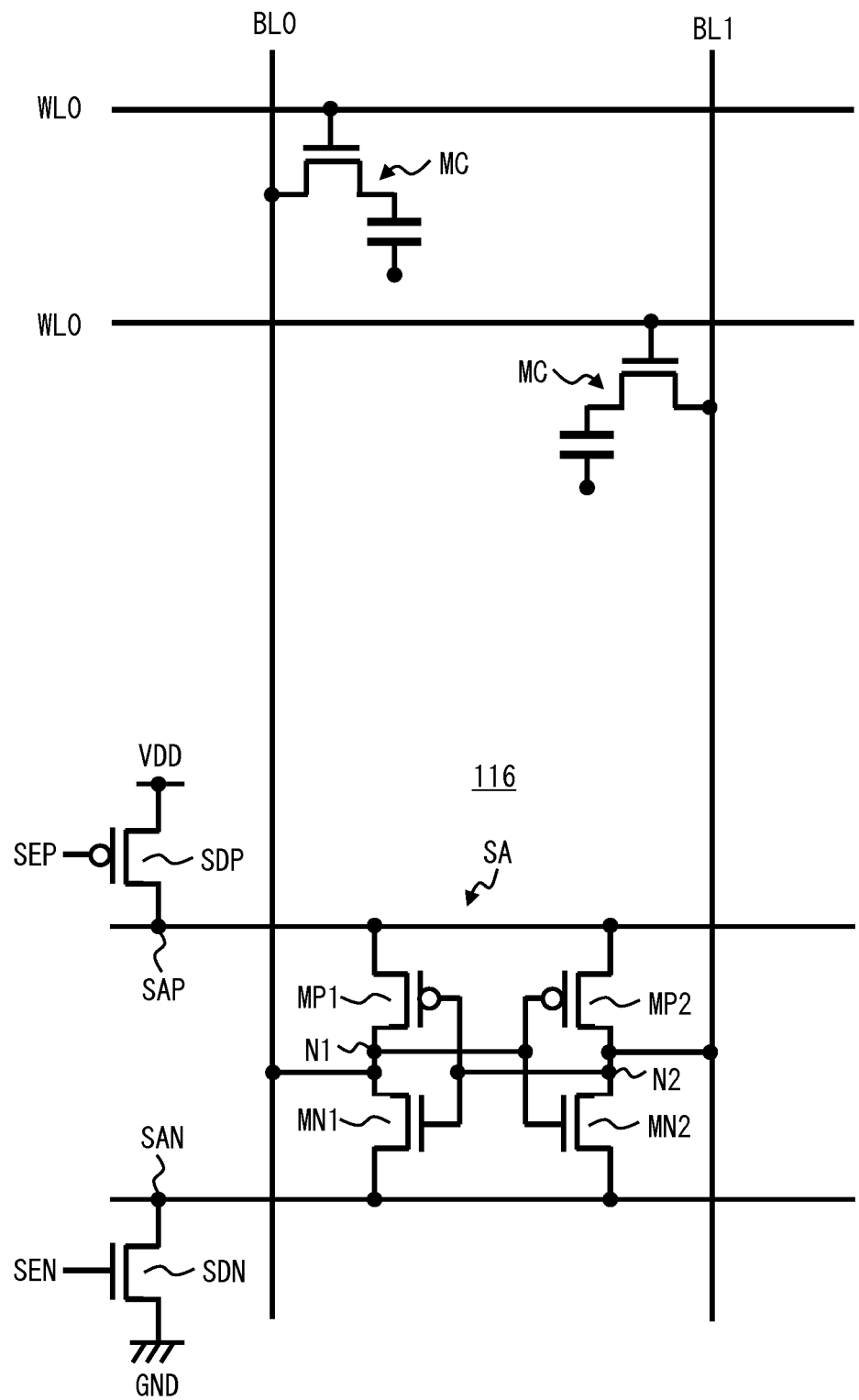
FIG. 8 is a circuit diagram showing a part of a sense amplifier unit.

FIG. 8 is a circuit diagram showing a part of the sense amplifier unit 116.

As shown in FIG. 8, the sense amplifier unit 116 includes a P-channel type MOS transistor SDP, an N-channel type MOS transistor SDN, and a plurality of sense amplifiers SA which are provided for a plurality of bit lines. FIG. 8 illustrates only one sense amplifier SA, which is provided for a pair of bit lines BL0 and LB1, among the plurality of sense amplifiers SA.

A MOS transistor MP1 has a source connected to a node SAP, a drain connected to a node N1, and a gate connected to a node N2. A MOS transistor MN1 has a source connected to a node SAN, a drain connected to the node N1, and a gate connected to the node N2. A MOS transistor MP2 has a source connected to the node SAP, a drain connected to the node N2, and a gate connected to the node N1. A MOS transistor MN2 has a source connected to the node SAN, a drain connected to the node N2, and a gate connected to the node N1. The MOS transistors MP1 and MN1 constitute a first inverter. The MOS transistors MP2 and MN2 constitute a second inverter. An output (node N1) of the first inverter is connected to each of an input of the second inverter and the bit line BL0. An output (node N2) of the second inverter is connected to each of an input of the first inverter and the bit line BL1.

The MOS transistor SDP is provided between the power supply voltage terminal VDD and the node SAP, and turning on/off of the MOS transistor SDP is controlled based on a sense amplifier activating signal SEP. The MOS transistor SDN is provided between the ground voltage terminal GND and the node SAN, and turning on/off of the MOS transistor SDN is controlled based on a sense amplifier activating signal SEN. In this case, the sense amplifier activating signals SEP and SEN are complementarily switched between an H level and an L level.

For example, when the sense amplifier activating signal SEP is at the L level and the sense amplifier activating signal SEN is at the H level, both the MOS transistors SDP and SDN turn on. This brings the sense amplifier SA (and the other sense amplifiers SA which are not shown) into an amplification operation enabled state. On the other hand, when the sense amplifier activating signal SEP is at the H level and the sense amplifier activating signal SEN is at the L level, both the MOS transistors SDP and SDN turn off. This brings the sense amplifier SA (and the other sense amplifiers SA which are not shown) into an amplification operation disabled state.

Figure 9:
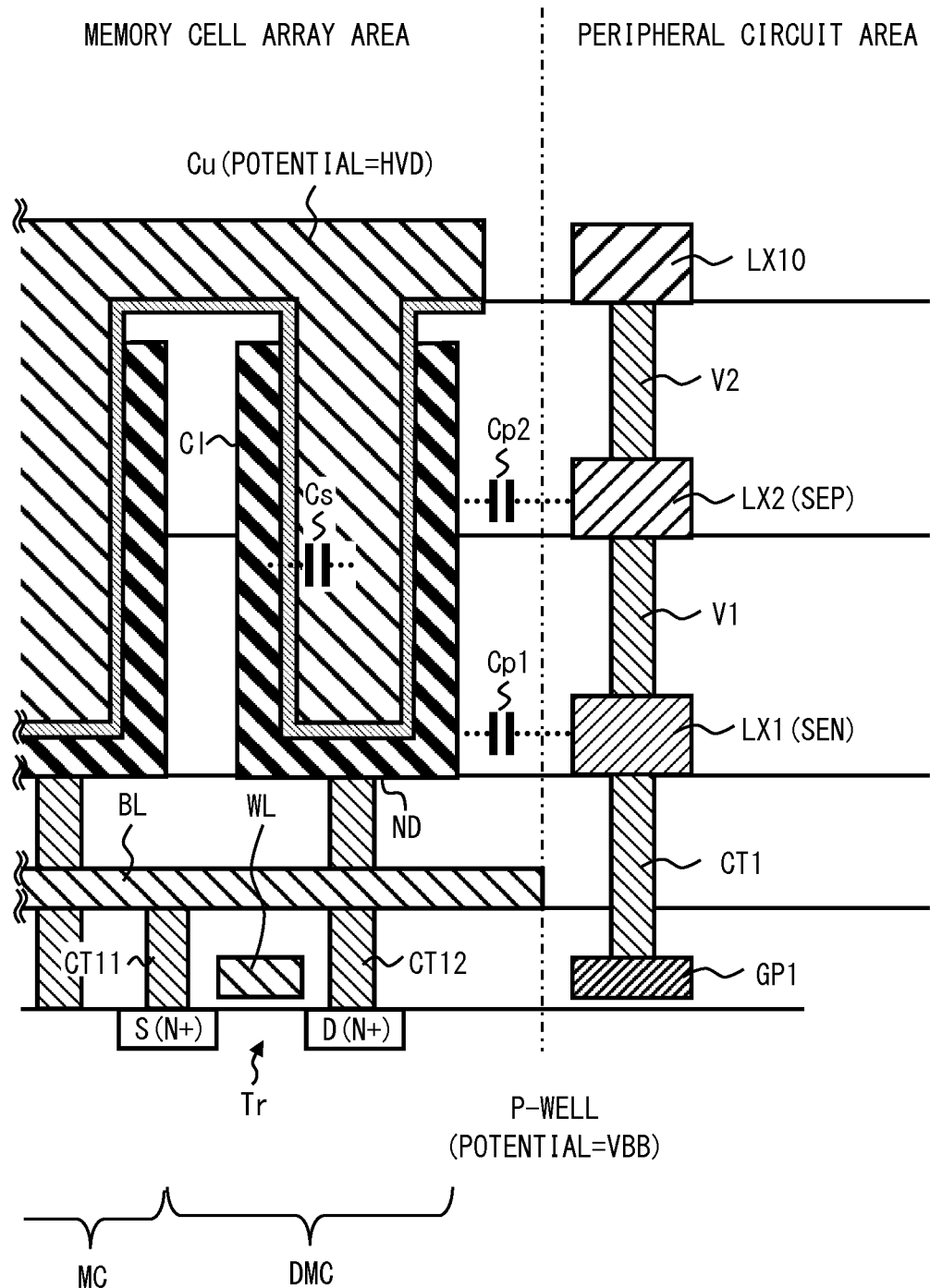
FIG. 9 is a sectional schematic view showing the vicinity of a boundary between the memory cell array and the peripheral circuits thereof.

FIG. 9 is a sectional schematic view showing the vicinity of a boundary between the memory cell array 111 and the peripheral circuits thereof. Referring to FIG. 9, as compared with the configuration shown in FIG. 4, the metal lines LX1 and LX2 are respectively supplied with the sense amplifier activating signals SEP and SEN, the potentials of which are complementarily changed, instead of being supplied with the intermediate potential HVD. In this manner, a pair of metal lines (for example, LX1 and LX2) may be respectively supplied with the sense amplifier activating signals SEP and SEN to control the activation of the sense amplifier unit 116. The metal lines LX1 and LX2 can be used not only for countermeasures against noise, but also for propagation of logic signals (sense amplifier activating signals SEP and SEN in this embodiment). This contributes to suppression of an increase in the circuit size.

Needless to say, the metal lines LX1 and LX2 may be respectively supplied with the sense amplifier activating signals SEP and SEN, the potentials of which are complementarily changed, and the metal line LY may be supplied with the same intermediate potential HVD as that for the cell plate electrode Cu.

When the memory cell array is disposed in such a manner that memory cell array is divided into a plurality of areas, the number of dummy memory cells DMC surrounding the memory cell array increases. Accordingly, the noise propagating through the dummy memory cells DMC has a serious effect on the memory cell array. In this regard, for example, when the potentials of some of the plurality of metal lines disposed along the outer periphery of the memory cell array divided into a plurality of areas change (that is, when a signal change occurs), the potentials of the other metal lines are configured to be fixed (or configured in such a manner that the potentials of each pair of the other metal lines complementarily change). At this time, it is necessary that the memory cell array divided into a plurality of areas be configured to be supplied with potentials, such as HVD, VKK, and VBB, from a common power supply. This configuration allows a portion of the memory cell array, which is not affected by noise, to function as a stabilizing capacitor, thereby making it possible to suppress the generation of noise. This is effective under the condition that the PN junction diode D1 does not turn on in the forward direction. Specifically, this is effective in a case where, for example, the amplitude of each signal propagating through metal lines is in a range from the power supply voltage VDD to the ground voltage GND. Since the signal lines through which logic signals propagate can be disposed so as to be adjacent to the memory cell array 111, the degree of freedom of design can be improved and an increase in the circuit size can be suppressed.

<Second Embodiment>

Figure 10:
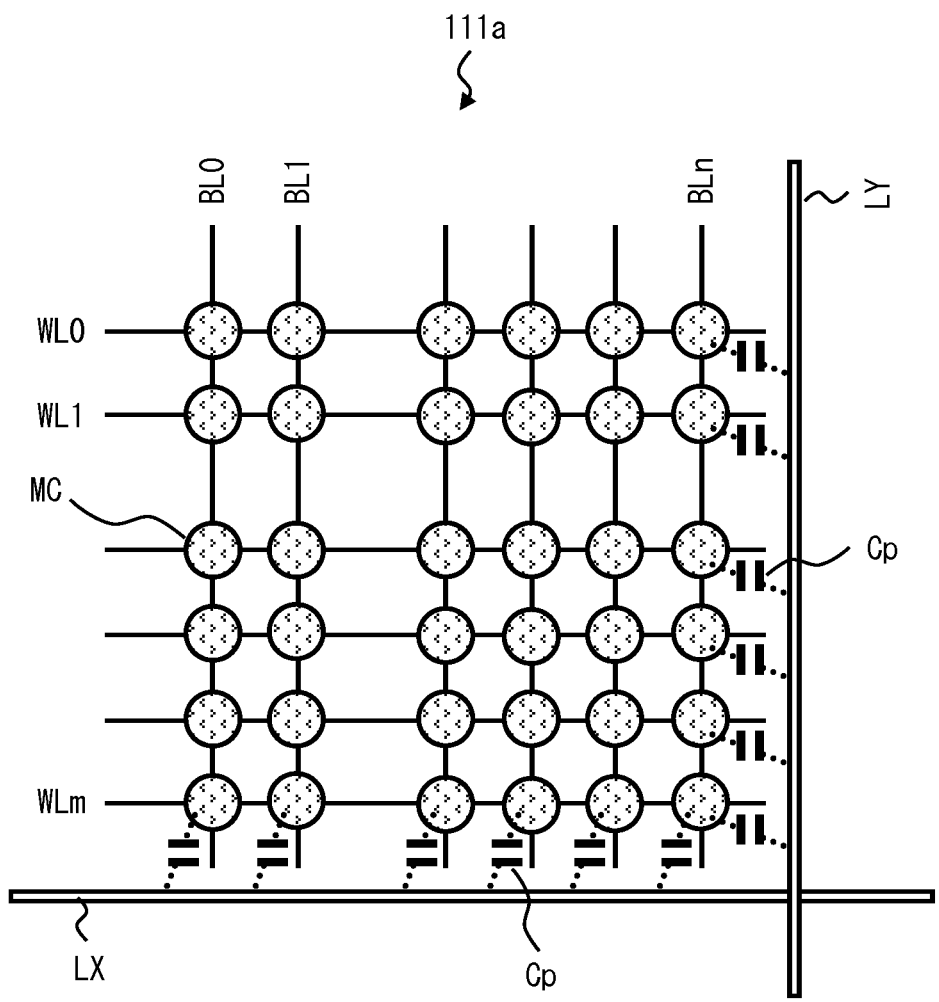
FIG. 10 is a plan view showing a memory cell array according to a second embodiment.

A DRAM 11*a* according to a second embodiment includes a memory cell array 111*a* instead of the memory cell array 111. FIG. 10 is a plan view showing the memory cell array 111*a*. Unlike the memory cell array 111, the memory cell array 111*a* does not include the plurality of dummy memory cells DMC surrounding the memory cells MC. The other components of the memory cell array 111*a* are similar to those of the memory cell array 111, and thus the description thereof is omitted.

Figure 11:
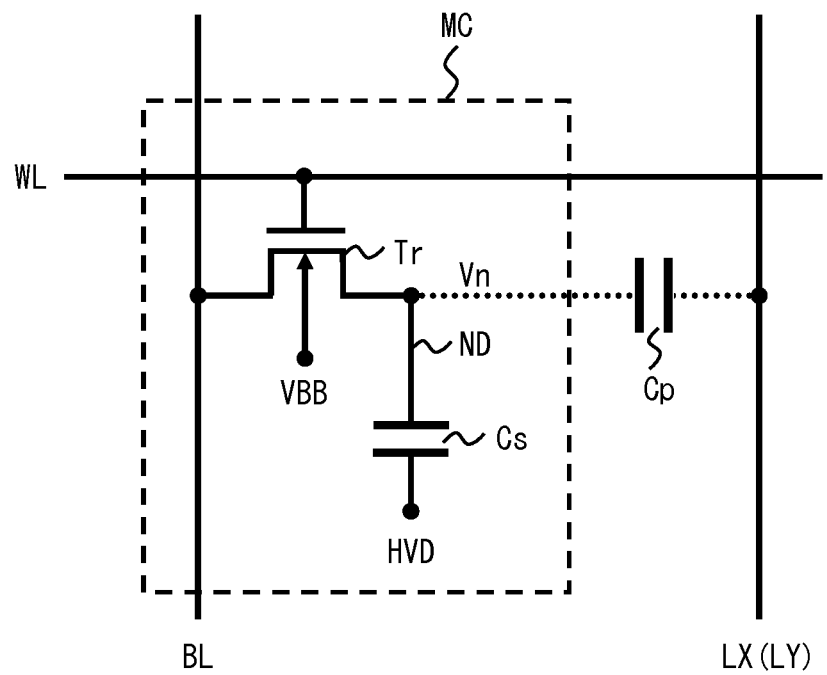
FIG. 11 is a circuit diagram showing a memory cell disposed on an outermost periphery of the memory cell array, and a metal line disposed so as to be adjacent to the memory cell.

First, the mechanism of noise propagation from the metal lines LX and LY to the memory cells MC will be described. FIG. 11 is a circuit diagram showing the memory cell MC disposed on the outermost periphery of the memory cell array 111*a*, and the metal line (hereinafter also referred to as "signal line") LX or LY disposed so as to be parallel and adjacent to the memory cells MC.

As shown in FIG. 11, the signal line LX or LY is connected to the storage node ND of the memory cell MC through the parasitic capacitance Cp. In the memory cell MC, the capacitive element Cs is supplied with the intermediate potential HVD, and the back gate of the transistor Tr is supplied with the voltage VBB.

Figure 12:
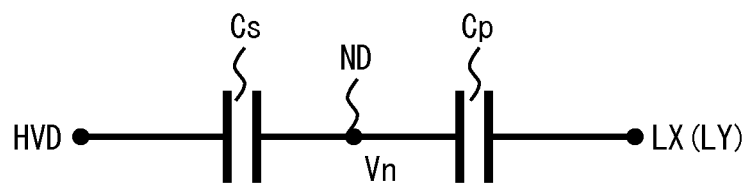
FIG. 12 shows an equivalent circuit of a memory cell in a state in which electric charge is accumulated in a storage node.

FIG. 12 shows an equivalent circuit of the memory cell MC in the state in which an electric charge is accumulated in the storage node ND when the transistor Tr turns off.

As shown in FIG. 12, the parasitic capacitance Cp is formed between the storage node ND and the signal line LX (or LY). The capacitive element Cs is formed between the storage node ND and the cell plate electrode (upper electrode) Cu representing the potential HVD. Assuming herein that a potential variation of the signal line LX (or LY) is represented as V, a potential variation ΔVn of the storage node ND can be represented by the following expression (1).

$$\Delta Vn = V \times Cp/(Cs+Cp) \tag{1}$$

It is obvious from the expression (1) that the potential variation ΔVn of the storage node ND with respect to a potential change of the signal line LX (or LY) increases in accordance with an increase in the parasitic capacitance Cp.

When the potential Vn of the storage node ND changes greatly, the data retention characteristics of each memory cell MC are liable to deteriorate. Therefore, it is necessary to reduce the potential variation ΔVn of the storage node ND by setting the potential variation V of the signal line LX (or LY) to a value as close to zero as possible.

In the DRAM 11a, as in the first embodiment, the peripheral circuits adjacent to the memory cell array 111a include the metal lines LX and LY that are adjacent to the lower electrode C1 of the capacitive element Cs in the horizontal direction and are supplied with a fixed potential. Since the potentials of the metal lines LX and LY are fixed, the potential Vn of the storage node ND of each memory cell MC does not change. Accordingly, deterioration in the data retention characteristics of each memory cell MC can be suppressed. As a result, the DRAM 11a can prevent occurrence of a malfunction.

Furthermore, the arrangement of the metal lines LX and LY so as to be parallel and adjacent to the plurality of memory cells MC disposed along the outer periphery of the memory cell array 111a can prevent the potentials Vn of the storage nodes ND of the plurality of memory cells MC from being concurrently changed. Thus, deterioration in the data retention characteristics of each memory cell MC can be more effectively suppressed.

Although not illustrated in FIG. 12, it is possible to reduce the noise that propagates through the path from the storage node ND to the word line WL through the parasitic capacitance Ct, as well as the noise that propagates through the path from the storage node ND to the Si substrate through the PN junction diode D1.

<Third Embodiment>

As compared with the DRAM 11 including the metal lines LX and LY that are supplied with a fixed potential, the method of setting potentials to be supplied to the dummy memory cells DMC is devised in a DRAM 11b according to a third embodiment.

Figure 13:
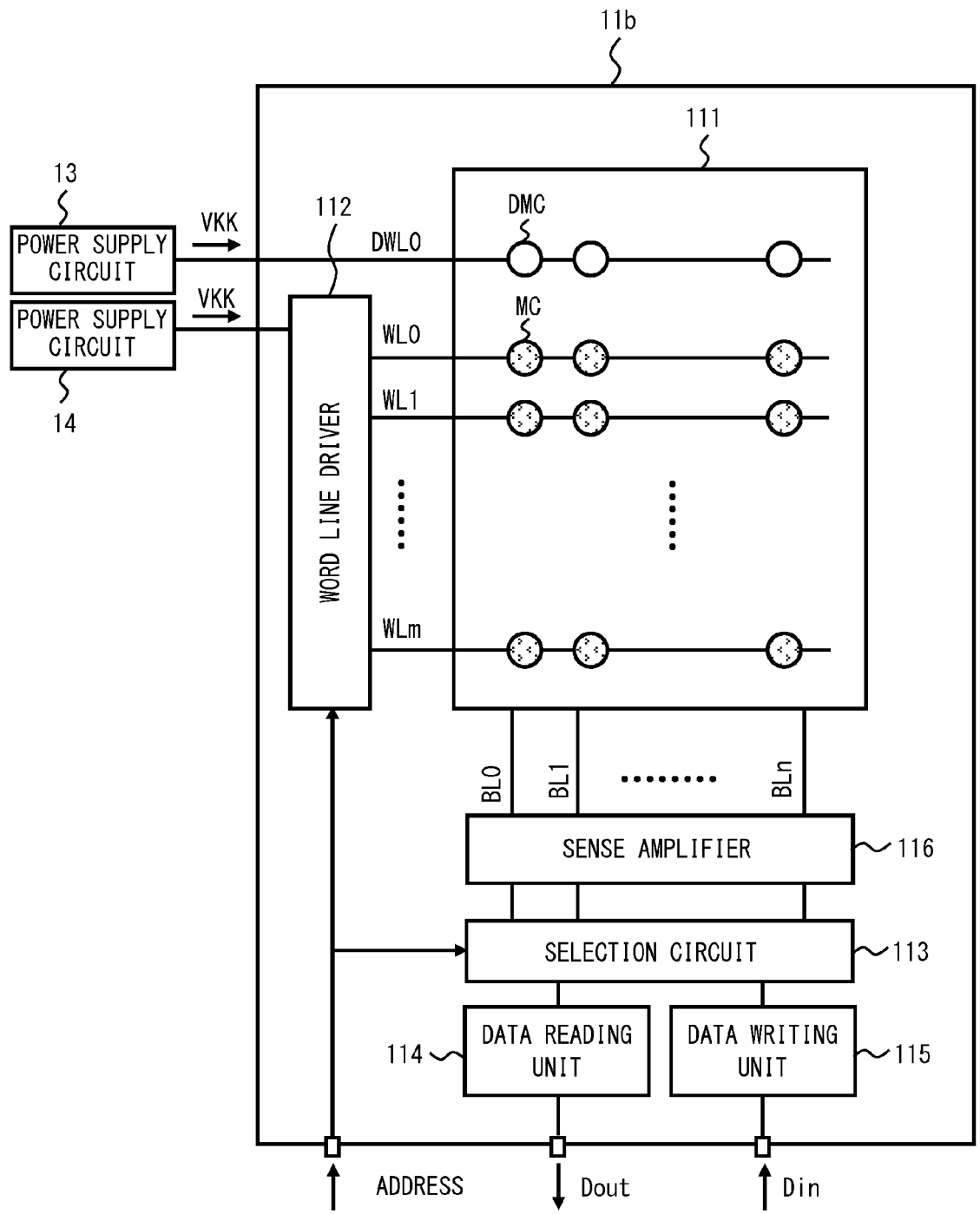
FIG. 13 is a block diagram showing a DRAM according to a third embodiment.

FIG. 13 is a block diagram showing the DRAM 11b.

As shown in FIG. 13, in the DRAM 11b, a power supply circuit that generates a potential to be supplied to the dummy memory cells DMC is provided separately from a power supply circuit that generates a potential for driving the memory cells MC. In this embodiment, only the power supply circuits that generate the potential VKK are illustrated as a representative of a plurality of power supply circuits that generate different potentials.

Specifically, in the DRAM 11b, power supply circuits 13 and 14 are provided outside of the DRAM 11b. The power supply circuit 13 supplies the potential VKK to the dummy word lines DWL. The power supply circuit 14 supplies the potential VKK to the word line driver 112. The word line driver 112 supplies the non-selected word lines WL with the potential VKK from the power supply circuit 14. Although not shown, power supply circuits that generate the potentials VBB and HVD to be supplied to the dummy memory cells DMC are provided separately from power supply circuits that generate the potentials VBB and HVD to be supplied to the memory cells MC. The other components of the DRAM 11b are similar to those of the DRAM 11, and thus the description thereof is omitted.

Thus, in the DRAM 11b, the power supply circuit that supplies the dummy memory cells DMC with the potential (such as VKK) is different from the power supply circuit that generates the potential (such as VKK) for driving the memory cells MC. In other words, the power supply line through which the potential VKK generated by the power supply circuit 13 propagates is not connected to the power supply line through which the potential VKK generated by the power supply circuit 14 propagates. Accordingly, even in the case where noise is generated in the dummy word line DWL0 when the potentials of the metal lines LX and LY, which are adjacent to the lower electrode C1 having a cylinder shape in each dummy memory cell DMC, fluctuate and the potential VKK fluctuates, the noise does not propagate through the word lines WL of the non-selected memory cells MC. Therefore, deterioration in the data retention characteristics of each memory cell MC can be suppressed. As a result, the DRAM 11b can prevent occurrence of a malfunction. Furthermore, since there is no need to provide the metal lines LX and LY that are supplied with a fixed potential, the degree of freedom of design can be improved and an increase in the circuit size can be suppressed.

Figure 14:
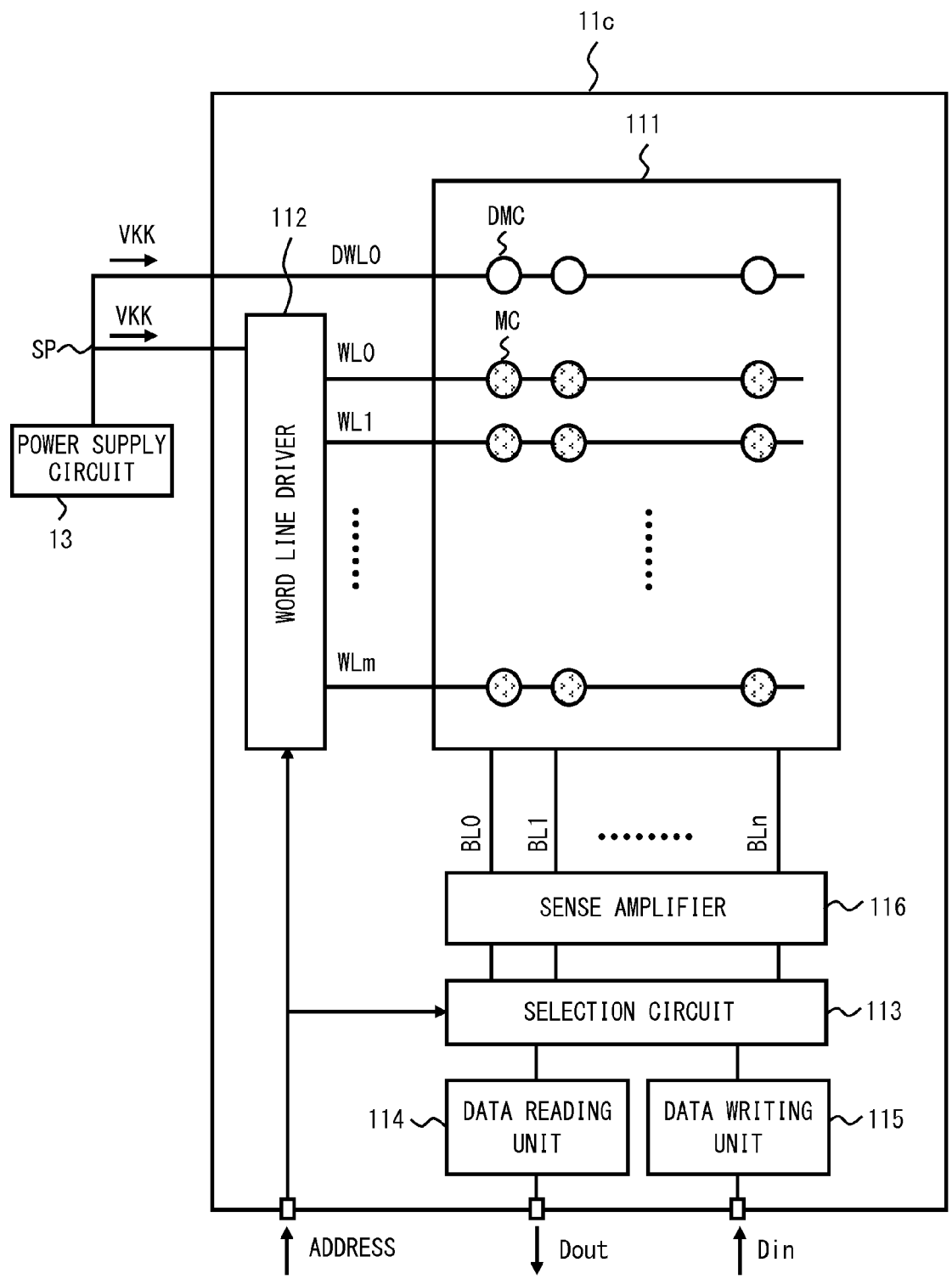
FIG. 14 is a block diagram showing the DRAM according to the third embodiment.

FIG. 14 is a block diagram showing a DRAM 11c as a modified example of the DRAM 11b.

As shown in FIG. 14, in the DRAM 11c, the power supply circuit that generates the potential to be supplied to the dummy memory cells DMC is the same as the power supply circuit that generates the potential to be supplied to the memory cells MC. However, a junction point of the power supply line that connects the power supply circuit with the memory cells DMC and MC is provided outside of the peripheral circuits that drive the memory cell array 111.

Specifically, in the DRAM 11c, the power supply circuit 13 is provided outside of the DRAM 11b. The power supply circuit 13 supplies the dummy word lines DWL and the word line driver 112 with the potential VKK. The word line driver 112 supplies the non-selected word lines WL with the potential VKK from the power supply circuit 13. In this case, a junction point SP of the power supply line through which the potential VKK propagates is provided outside of the peripheral circuits (for example, the word line driver 112) that drive the memory cell array 111. Although not shown, junction points of the power supply lines through which the potentials VBB and HVD propagate, respectively, are also provided outside of the peripheral circuits that drive the memory cell array 111. The other components of the DRAM 11c are similar to those of the DRAM 11b, and thus the description thereof is omitted.

With this configuration, even in the case where noise is generated in the dummy word line DML0 when the potentials of the metal lines LX and LY, which are adjacent to the lower electrode C1 having a cylinder shape in each dummy memory cell DMC, fluctuate and the potential VKK fluctuates, the noise is prevented from propagating to the word lines WL of the non-selected memory cells MC through the power supply line. Accordingly, deterioration in the data retention characteristics of each memory cell MC can be suppressed. As a result, the DRAM 11c can prevent occurrence of a malfunction. Furthermore, since there is no need to provide the metal lines LX and LY that are supplied with a fixed potential, the degree of freedom of design can be improved and an increase in the circuit size can be suppressed.

An external power supply circuit for, for example, the power supply voltage VDD or the ground voltage GND, may be used as the power supply circuit that generates the potential to be supplied to the dummy memory cells DMC, instead of using an internal power supply circuit. The power supply voltage VDD and the ground voltage GND which are supplied from the outside do not fluctuate even when the potentials of the metal lines LX and LY change. This prevents the noise from propagating from the dummy word lines DML to the word lines WL of the non-selected memory cells MC. Therefore, deterioration in the data retention characteristics of each memory cell MC can be suppressed.

Figure 15:
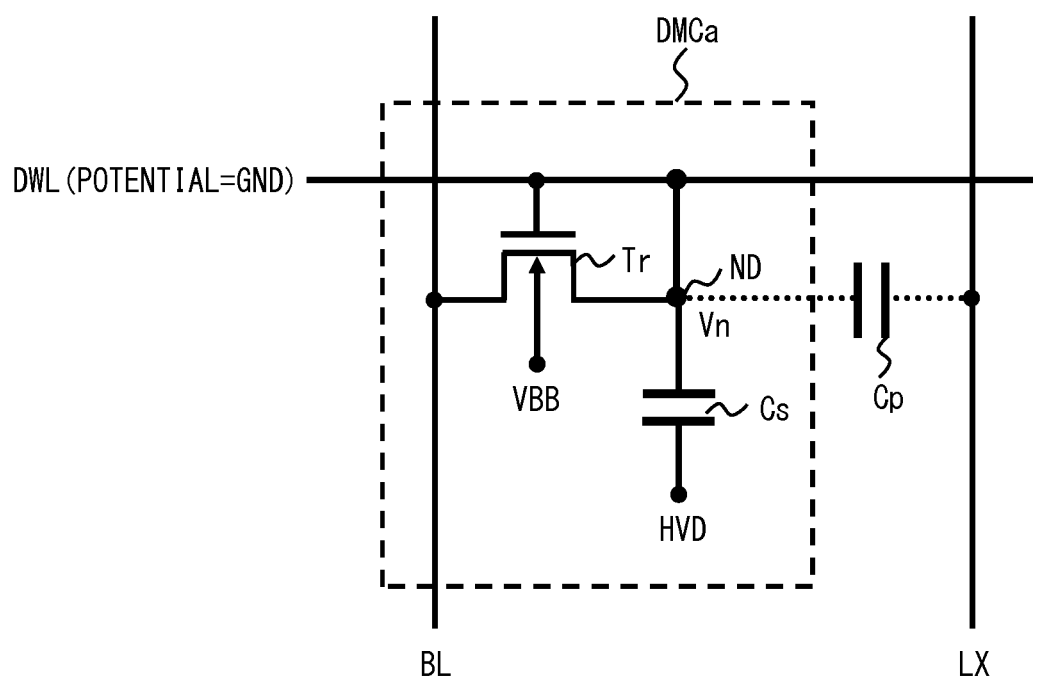
FIG. 15 is a circuit diagram showing a modified example of a plurality of dummy memory cells disposed in a word line direction.
Figure 16:
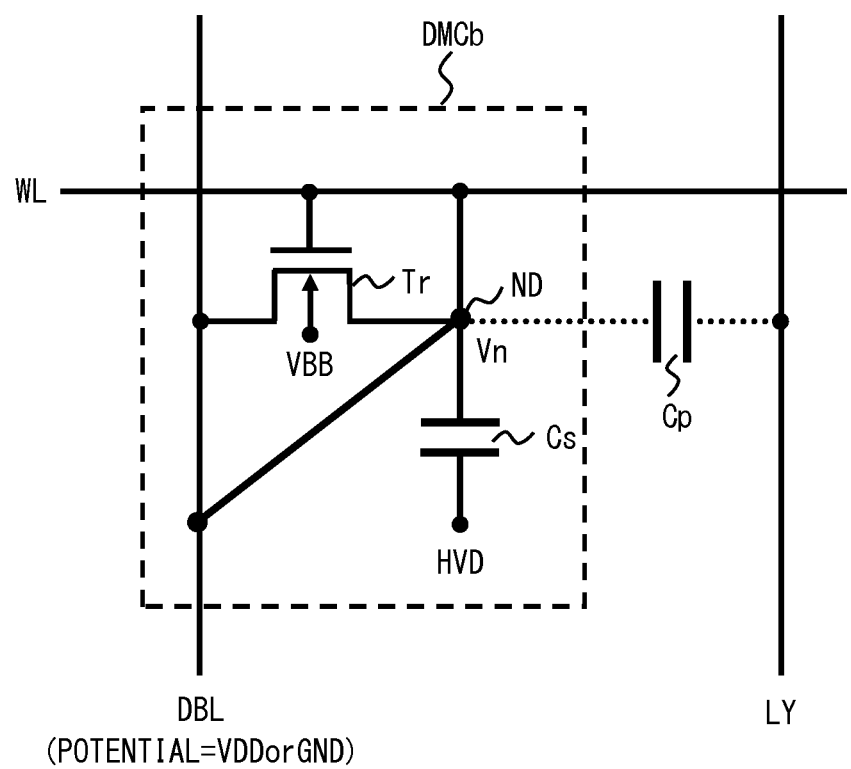
FIG. 16 is a circuit diagram showing a modified example of a plurality of dummy memory cells disposed in a bit line direction.

Other examples will be described with reference to FIGS. 15 and 16. FIG. 15 is a circuit diagram showing a dummy memory cell DMCa as a modified example of the plurality of dummy memory cells DMC disposed in the word line direction. FIG. 16 is a circuit diagram showing a dummy memory cell DMCb as a modified example of the plurality of dummy memory cells DMC disposed in the bit line direction.

As shown in FIG. 15, unlike the dummy memory cell DMC, the dummy memory cell DMCa is short-circuited with the storage node ND and the dummy word line DWL. The dummy word line DWL is supplied with the ground voltage GND so as to bring the dummy memory cell into the non-selected state. As a result, the potential Vn of the storage node ND of the dummy memory cell DMC is fixed at the ground voltage GND level. Accordingly, even when the potentials of the metal lines LX and LY change, the potential Vn of the storage node ND of each dummy memory cell DMC does not change. This prevents the noise from propagating from the dummy memory cells DMC to the memory cells MC, with the result that deterioration in the data retention characteristics of each memory cell MC can be suppressed.

As shown in FIG. 16, in the dummy memory cell DMCb, the storage node ND and the dummy bit line DBL are short-circuited, unlike in the dummy memory cell DMC. The dummy bit line DBL is supplied with the power supply voltage VDD or the ground voltage GND. Accordingly, the potential Vn of the storage node ND of the dummy memory cell DMC is fixed at the power supply voltage VDD level or the ground voltage GND level. Therefore, even when the potentials of the metal lines LX and LY change, the potential Vn of the storage node ND of the dummy memory cell DMC does not change. This prevents the noise from propagating from the dummy memory cells DMC to the memory cells MC, with the result that deterioration in the data retention characteristics of each memory cell MC can be suppressed.

It is preferable to eliminate the difference in structure between the dummy memory cells DMCa and DMCb and the memory cells MC as much as possible. The allowable range of the difference in structure is determined depending on the degree of effect of the production process on the shape stability. If the difference is in the allowable range, the dummy memory cells DMCa and DMCb can be used as effective means without increasing the circuit size.

<Fourth Embodiment>

Figure 17:
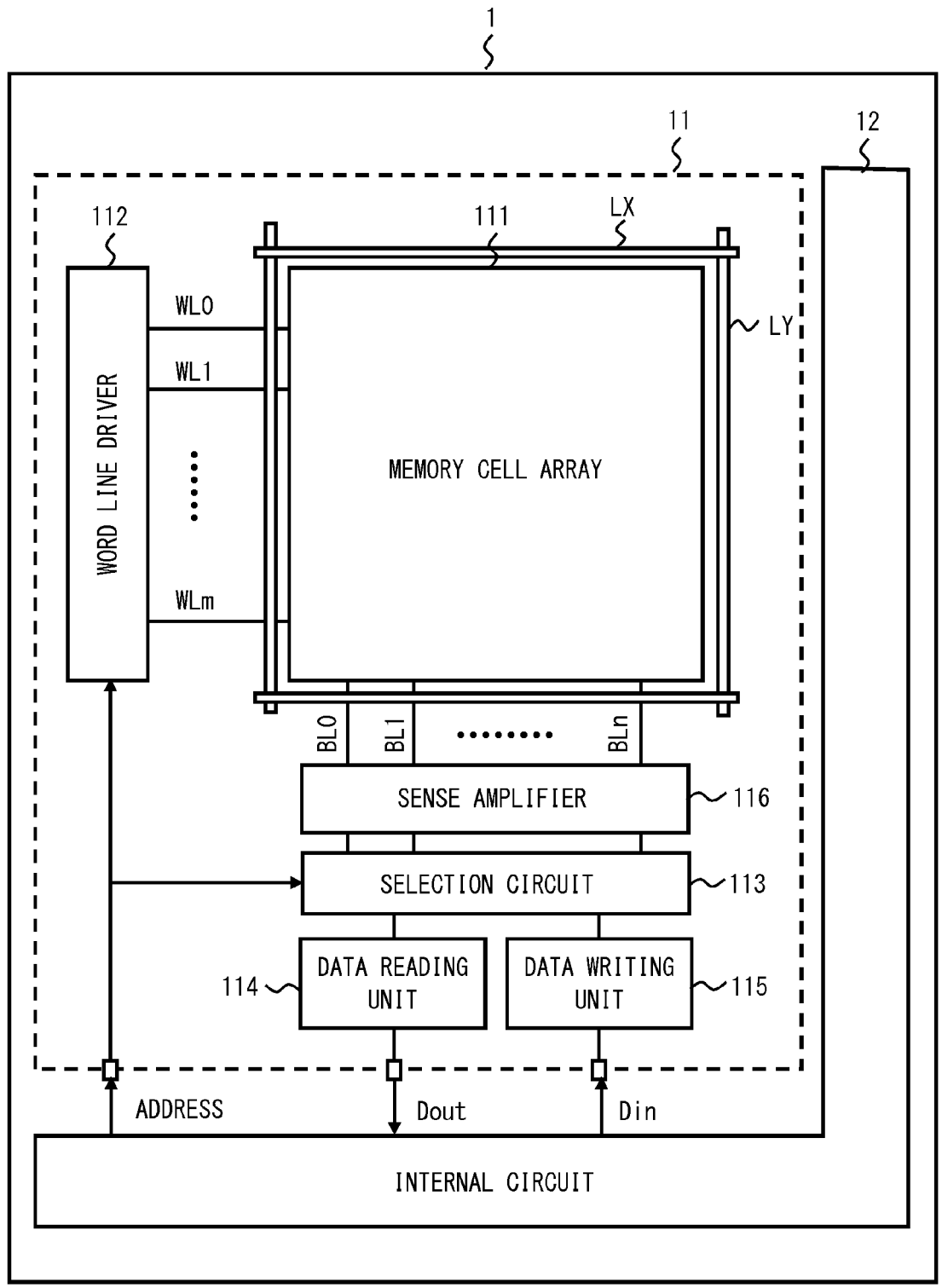
FIG. 17 is a block diagram showing a semiconductor device according to a fourth embodiment.

FIG. 17 is a block diagram showing a system LSI (semiconductor device) 1 that incorporates the DRAM 11. The system LSI 1 includes the DRAM 11, which is defined as a macro, and an internal circuit (peripheral circuit) 12 that exchanges data with the DRAM 11. For example, the internal circuit 12 outputs the write data Din to be written into the DRAM 11, and receives the data Dout read out from the DRAM 11.

In an automatic arrangement/wiring process of system LSI design, a logic signal line is automatically arranged around the DRAM 11 in accordance with an automatic design after the arrangement of the DRAM 11 that is defined as a macro. Even in the case where the signal line supplied with a fixed potential is provided between the peripheral circuit and the memory cell array 111 in the DRAM 11 defined as a macro, it is considered that noise is generated due to the logic signal line of the internal circuit 12, which is automatically arranged so as to be adjacent to the memory cell array 111, when the memory cell array 111 is designed so as to be adjacent to the outer periphery of the DRAM 11. For this reason, in the arrangement/wiring process for the internal circuit 12, the signal line disposed along the outer periphery of the memory cell array 111 is supplied with a fixed potential, or the pair of signal lines disposed along the outer periphery of the memory cell array 111 is supplied with complementary potentials. This configuration enables the DRAM 11 to reduce the effect of noise from the peripheral circuits provided in the DRAM 11 and to reduce the effect of noise from the internal circuit 12 provided outside of the DRAM 11. Therefore, deterioration in the data retention characteristics of each memory cell MC can be suppressed.

In the case of performing the arrangement/wiring process for the internal circuit 12 in the automatic arrangement/wiring process of system LSI design, the internal circuit 12 may be designed in such a manner that no signal lines are arranged in the vicinity of the outer periphery of the memory cell array 111. In another alternative, if signal lines are arranged in the vicinity of the outer periphery of the memory cell array 111, an error may be returned as an arrangement/wiring result. This makes it possible to develop semiconductor products with high reliability and low cost even in the case of using complicated and various system LSIs.

While the fourth embodiment has illustrated an example in which the DRAM 11 is incorporated in the system LSI 1, the type of the DRAM to be incorporated in the system LSI 1 is not limited to this. For example, the DRAM 11b, the DRAM 11c, and the like may be incorporated in the system LSI 1. For example, when the DRAM 11b in which the power supply circuit that generates the potential for driving the dummy memory cells DMC is different from the power supply circuit that generates the corresponding potential for driving the memory cells MC is defined as a macro, the DRAM 11b can achieve a stable operation by reducing the effect of noise from the outside, even if the DRAM 11b is incorporated in various types of system LSIs.

(Regarding Japanese Unexamined Patent Application Publication No. 10-284494)

Note that the configuration disclosed in Japanese Unexamined Patent Application Publication No. H10-284494 does not include the metal lines that are disposed so as to be adjacent to the lower electrode of the capacitive element in each memory cell in the horizontal direction. Accordingly, in the configuration disclosed in Japanese Unexamined Patent Application Publication No. H10-284494, the problem that the data retention characteristics of each memory cell deteriorate due to noise from the metal lines adjacent to the lower electrode in the horizontal direction does not occur in the first place. That is, the configuration of the DRAMs according to the above embodiments is quite different from the configuration disclosed in Japanese Unexamined Patent Application Publication No. H10-284494.

The present invention made by the present inventor has been described above with reference to embodiments. However, the present invention is not limited to the above embodiments and can be modified in various manners without departing from the scope of the invention.

For example, in the semiconductor devices according to the embodiments described above, the conductivity type (p-type or n-type) of a semiconductor substrate, a semiconductor layer, a diffusion layer (diffusion area), and the like may be reversed. Accordingly, when one of the conductivity types of the n-type and the p-type is defined as a first conductivity type and the other conductivity type is defined as a second conductivity type, the first conductivity type may be the p-type and the second conductivity type may be the n-type. On the contrary, the first conductivity type may be the n-type and the second conductivity type may be the p-type.

The first to forth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device, comprising:
   a memory cell array including a plurality of memory cells disposed in a matrix; and
   a peripheral circuit adjacent to the memory cell array, wherein each of the memory cells comprises:
      a capacitive element including a lower electrode having a cylinder shape extending in a direction perpendicular to a principal surface of a Si substrate; and
      a switch transistor coupled between the lower electrode of the capacitive element and a bit line, turning on/off of the switch transistor being controlled based on a potential of a word line, and
   wherein the peripheral circuit comprises:
      a signal line that is adjacent to the lower electrode in a horizontal direction parallel to the principal surface of the Si substrate and is configured to be supplied with a fixed potential, or a pair of signal lines respectively supplied with complementary potentials, and
   wherein the signal line or the pair of the signal lines is formed in a position higher than a bottom of the lower electrode and lower than a top of the lower electrode.

2. The semiconductor device according to claim 1, wherein the signal line or the pair of signal lines is disposed along an outer periphery of the memory cell array.

3. The semiconductor device according to claim 1, wherein among the plurality of memory cells, a plurality of memory cells disposed along an outer periphery of the memory cell array comprise dummy memory cells.

4. The semiconductor device according to claim 1, wherein the memory cell array is divided into a plurality of areas, and
   wherein, when potentials of some of the plurality of signal lines disposed along an outer periphery of the memory cell array divided into the plurality of areas are changed, potentials of other signal lines are fixed, or potentials of each pair of the other signal lines are complementarily changed.

5. The semiconductor device according to claim 1, wherein one of the pair of signal lines is disposed along one side of an outer periphery of the memory cell array, and another one of the pair of signal lines is disposed along a side opposed to the one side.

6. The semiconductor device according to claim 1, wherein the peripheral circuit comprises a circuit that drives the memory cell array, and
   wherein the semiconductor device comprises a Dynamic Random Access Memory (DRAM).

7. The semiconductor device according to claim 1, wherein the memory cell array constitutes a Dynamic Random Access Memory (DRAM), and wherein the peripheral circuit outputs data to be written into the DRAM, or receives data read out from the DRAM.

8. The semiconductor device according to claim 1, wherein the plurality of memory cells comprises dummy memory cells disposed along an outer periphery of the memory cell array such that the signal line is disposed parallel and adjacent to the dummy memory cells.

9. The semiconductor device according to claim 8, wherein the signal line is connected to a storage node of each of the dummy memory cells through a parasitic capacitance.

10. The semiconductor device according to claim 9, wherein another parasitic capacitance is formed between the word line and the storage node.

11. The semiconductor device according to claim 1, wherein the peripheral circuit comprises the signal line that is adjacent to the lower electrode.

12. The semiconductor device according to claim 1, wherein the peripheral circuit comprises the pair of signal lines respectively supplied with the complementary potentials.

13. The semiconductor device according to claim 1, wherein the plurality of memory cells comprises dummy memory cells disposed along an entirety of an outer periphery of the memory cell array.

14. The semiconductor device according to claim 13, wherein the dummy memory cells are arranged in a first array in the direction perpendicular to the principal surface and in a second array in the horizontal direction parallel to the principal surface.

15. The semiconductor device according to claim 1, further comprising a plurality of dummy memory cells encircling the plurality of memory cells,
   wherein each of the dummy memory cells comprises:
      a capacitive element including a lower electrode having a cylinder shape and extending in the direction perpendicular to the principal surface of the Si substrate, and an upper electrode; and
      a switch transistor coupled to the capacitive element,
   wherein the signal line or the pair of the signal lines is disposed adjacent to an opposite side of the memory cells, and
   wherein the upper electrode of the capacitive element of each of the dummy memory cells and an upper electrode of the capacitive element of each of the memory cells are connected to each other.

16. A semiconductor device, comprising:
   a plurality of memory cells disposed in a matrix; and
   a plurality of dummy memory cells encircling the plurality of memory cells, wherein each of the memory cells and each of the dummy memory cells comprise:
      a capacitive element including a lower electrode having a cylinder shape extending in a direction perpendicular to a principal surface of a substrate; and
      a switch transistor provided between the capacitive element and a bit line, turning on/off of the switch transistor being controlled based on a potential of a word line; and
   a power supply circuit that generates a potential to be supplied to dummy word lines of the dummy memory cells is different from a power supply circuit that generates a corresponding potential to be supplied to non-selected word lines of the memory cells.

17. The semiconductor device according to claim 16, wherein the power supply circuit that generates the potential for driving the dummy memory cells comprises an external power supply circuit that generates at least one of a power supply voltage and a ground voltage.

18. The semiconductor device according to claim 17, wherein the power supply circuit that generates the potential for driving the dummy memory cells supplies a dummy bit line or a dummy word line of the dummy word lines with one of a power supply voltage and a ground voltage, the dummy bit line or the dummy word line being provided for each of the dummy memory cells.

19. The semiconductor device according to claim 18, wherein a storage node of each of the dummy memory cells and the dummy bit line or the dummy word line are short-circuited.

20. The semiconductor device according to claim 16, further comprising a peripheral circuit, wherein the plurality of memory cells and the plurality of dummy memory cells constitute a memory cell array,
    wherein the peripheral circuit drives the memory cell array, and
    wherein the semiconductor device is a Dynamic Random Access Memory (DRAM).

21. The semiconductor device according to claim 16, wherein the plurality of memory cells and the plurality of dummy memory cells constitute a Dynamic Random Access Memory (DRAM), and
    wherein the semiconductor device further comprises a peripheral circuit that outputs data to be written into the DRAM, or receives data read out from the DRAM.

\* \* \* \* \*